(12) United States Patent
Fukue

(10) Patent No.: US 11,251,890 B2
(45) Date of Patent: Feb. 15, 2022

(54) MIXING APPARATUS AND MIXING METHOD

(71) Applicant: Clarion Co., Ltd., Saitama (JP)

(72) Inventor: Kazutomo Fukue, Kitamoto (JP)

(73) Assignee: CLARION CO., LTD., Saitama (JP)

( * ) Notice: Subject to any disclaimer, the term of this patent is extended or adjusted under 35 U.S.C. 154(b) by 0 days.

(21) Appl. No.: 16/887,849

(22) Filed: May 29, 2020

(65) Prior Publication Data

US 2020/0389241 A1    Dec. 10, 2020

(30) Foreign Application Priority Data

Jun. 4, 2019   (JP) .............................. JP2019-104249

(51) Int. Cl.
*H04H 60/04*    (2008.01)
*G06F 3/16*    (2006.01)

(52) U.S. Cl.
CPC ............. *H04H 60/04* (2013.01); *G06F 3/165* (2013.01)

(58) Field of Classification Search
CPC .......... H04H 60/04; G06F 3/165; G10H 1/12; G10H 1/46; G10L 21/02; G10L 21/0364; H03G 3/32; H04S 7/00
See application file for complete search history.

(56) References Cited

U.S. PATENT DOCUMENTS

| | | | |
|---|---|---|---|
| 5,228,093 A * | 7/1993 | Agnello ................. | H04H 60/04 381/103 |
| 9,280,986 B2 | 3/2016 | Hashimoto et al. | |
| 9,584,906 B2 | 2/2017 | Takahashi et al. | |
| 10,779,105 B1 * | 9/2020 | Clark ...................... | H04S 3/008 |
| 2008/0319564 A1* | 12/2008 | Furge ...................... | H04S 3/02 700/94 |
| 2012/0263322 A1* | 10/2012 | Lovitt ..................... | H04R 3/04 381/119 |
| 2014/0219478 A1 | 8/2014 | Takahashi et al. | |
| 2015/0030171 A1 | 1/2015 | Hashimoto et al. | |

FOREIGN PATENT DOCUMENTS

| | | |
|---|---|---|
| JP | 2013-051589 A | 3/2013 |
| JP | 2013-190470 A | 9/2013 |

* cited by examiner

*Primary Examiner* — David L Ton
(74) *Attorney, Agent, or Firm* — Foley & Lardner LLP

(57) ABSTRACT

A mixing apparatus comprises a weighting circuit configured to, within a particular control target band, perform weighting amplitude spectra of a priority audio signal and a non-priority audio signal taking frequency masking and time masking into account, an amplitude changer configured to relatively amplify an amplitude spectrum of the priority audio signal within the control target band based on the amplitude spectrum to which the weighting has been applied, a phase changer configured to make a phase spectrum of the non-priority audio signal approach a phase spectrum of the priority audio signal, within the control target band, based on the amplitude spectrum to which the weighting has been applied, and a mixer configured to mix the priority audio signal and the non-priority audio signal after the amplitude spectrum and the phase spectrum are changed.

16 Claims, 22 Drawing Sheets

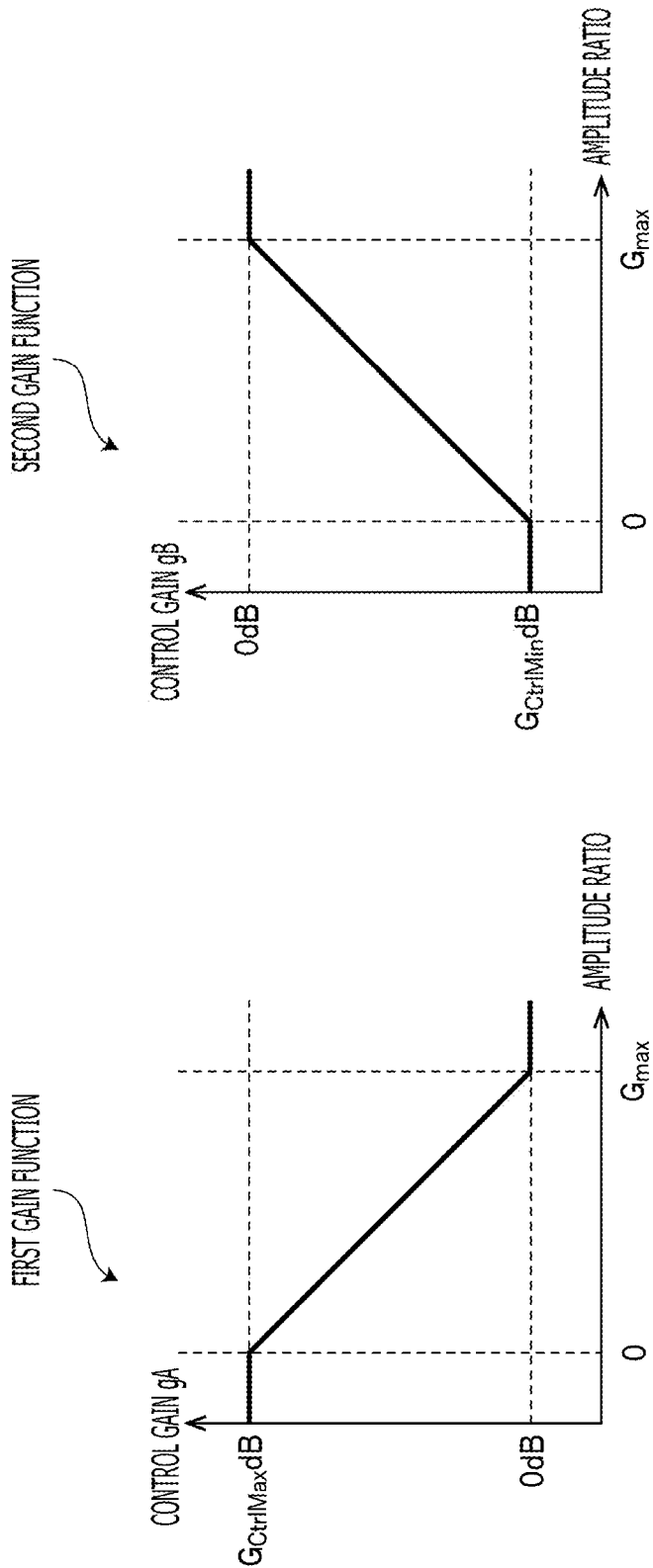

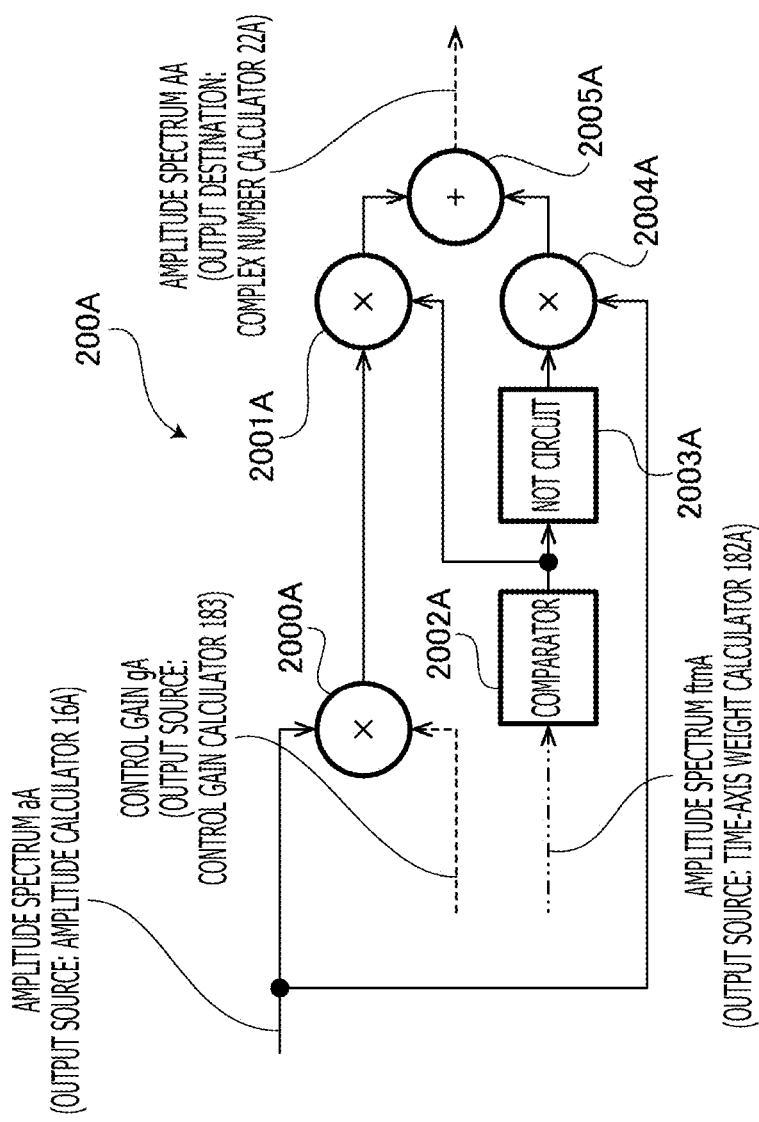

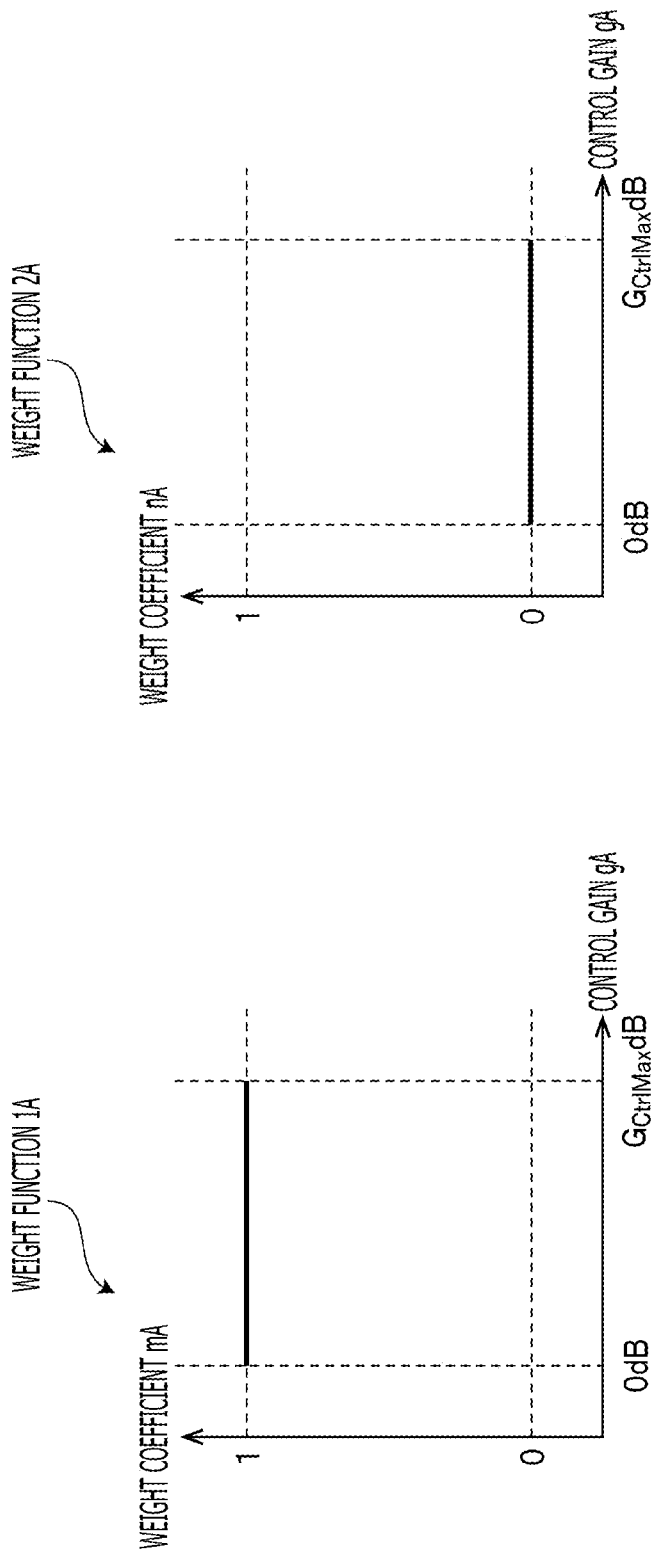

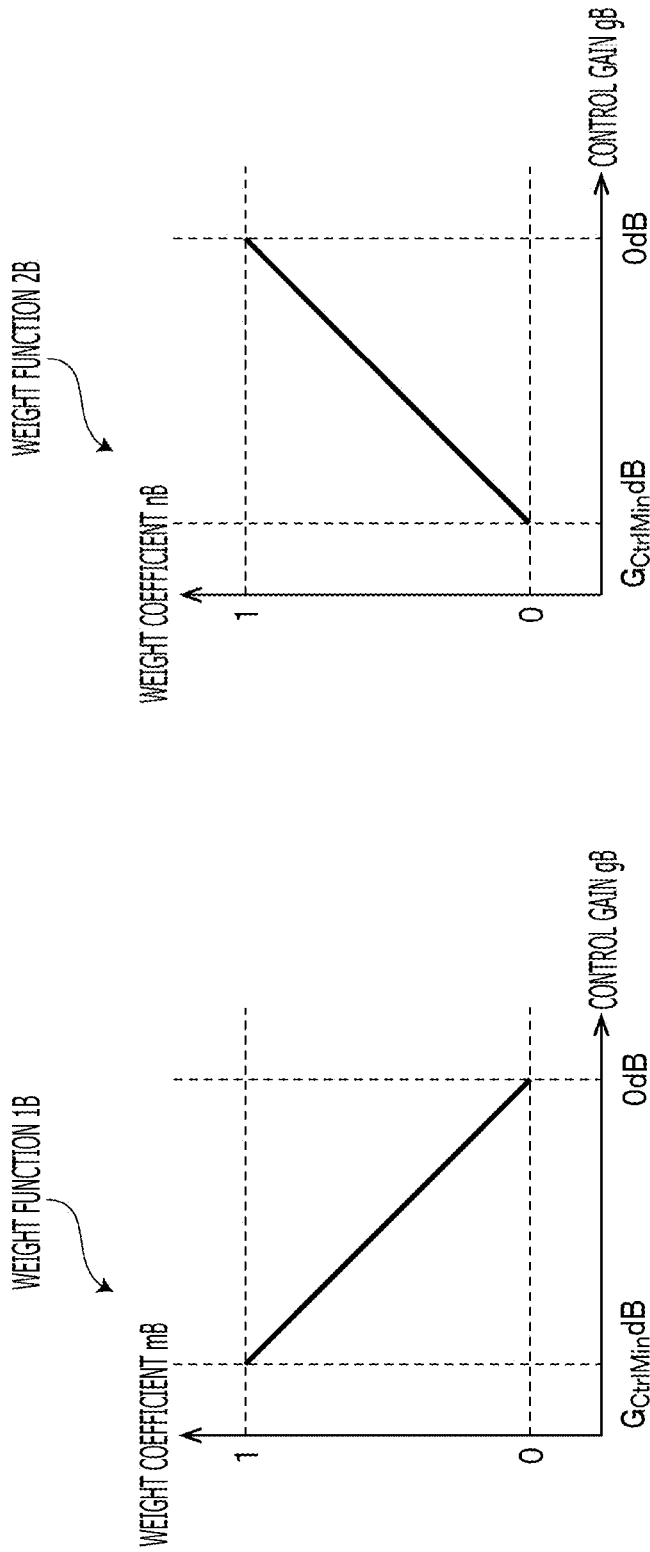

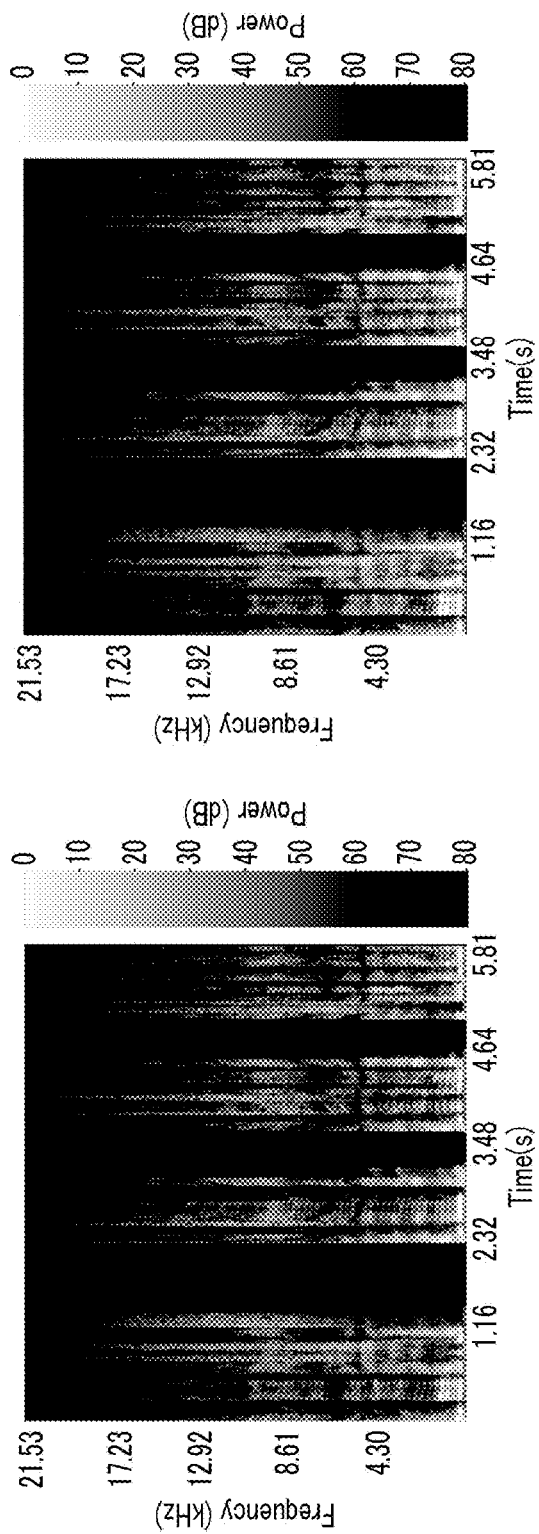

MIXING APPARATUS AND MIXING METHOD

CROSS-REFERENCE TO RELATED APPLICATIONS

This application claims priority under 35 U.S.C. § 119 from Japanese Patent Application No. 2019-104249 filed on Jun. 4, 2019. The entire subject matter of the application is incorporated herein by reference.

BACKGROUND

Technical Field

The present disclosures relate to a mixing apparatus and a mixing method.

Related Art

There has been known a mixing apparatus configured to mix audio signals respectively input from a plurality of sound source circuits. In such a mixing apparatus, when an audio guidance signal is input from a navigation device in a case where a music signal is being input from a car audio device, a quieting processing is temporarily applied to the music signal and the audio guidance signal is mixed with the quieted music signal. This makes a car driver clearly listen to the audio guidance. However, a passenger who is listening to the music has an inconvenience since a volume of the music he/she is listening to temporarily becomes too low.

There has been conventionally known a mixing apparatus configured to convert each of audio signals input from a plurality of sound source circuits into data on a time-frequency plane, and adjust amplitude and phase represented by the converted data on the time-frequency plane to ensure audibility of the sound of the sound source circuit that the listener wishes to listen to without significantly changing amplitude of a sound signal output from each sound source circuit.

In the conventional mixing apparatus, even when a music piece is played in a car, audibility of the audio guidance is ensured.

SUMMARY

However, according to the conventional mixing apparatus, there could be a case where a sound corresponding to a sound source circuit is masked by another sound corresponding to another sound source circuit, and the listener cannot clearly listen to the sound the listener wishes to clearly listen to.

Hereinafter, a sound of a sound source circuit that the listener wishes to clearly listen to (i.e., a sound having a higher priority) will be referred to as a "priority sound" and a sound of another sound source circuit having a lower priority than the priority sound will be referred to as a "non-priority sound."

A mixing apparatus according to an illustrative embodiment of the present disclosures is configured to mix a first audio signal representing a first sound and a second audio signal representing a second sound to enable a listener to listen to the first sound in a more prioritized manner than the second sound. The mixing apparatus comprises a weighting circuit configured to perform weighting, within a particular control target band, an amplitude spectrum of at least one of the first audio signal and the second audio signal taking at least one of frequency masking and time masking into account, an amplitude changer configured to perform an amplitude spectrum changing process of relatively amplifying an amplitude spectrum of the first audio signal within the control target band by changing the amplitude spectrum of the at least one of the first audio signal and the second audio signal based on the amplitude spectrum to which the weighting has been applied, a phase changer configured to perform a phase spectrum changing process of making a phase spectrum of the second audio signal approach a phase spectrum of the first audio signal, within the control target band, by changing a phase spectrum of at least one of the first audio signal and the second audio signal based on the amplitude spectrum to which the weighting has been applied, and a mixer configured to mix the first audio signal and the second audio signal after the amplitude spectrum changing process and the phase spectrum changing process have been performed.

A mixing method according to an illustrative embodiment of the present disclosures is a method for mixing a first audio signal representing a first sound and a second audio signal representing a second sound to enable a listener to listen to the first sound in a more prioritized manner than the second sound. The mixing method includes a weighting step of performing weighting, within a particular control target band, an amplitude spectrum of at least one of the first audio signal and the second audio signal taking at least one of frequency masking and time masking into account, an amplitude changing step of perform an amplitude spectrum changing process of relatively amplifying an amplitude spectrum of the first audio signal within the control target band by changing the amplitude spectrum of the at least one of the first audio signal and the second audio signal based on the amplitude spectrum to which the weighting has been applied, a phase changing step of performing a phase spectrum changing process of making a phase spectrum of the second audio signal approach a phase spectrum of the first audio signal, within the control target band, by changing a phase spectrum of at least one of the first audio signal and the second audio signal based on the amplitude spectrum to which the weighting has been applied, and a mixing step of mixing the first audio signal and the second audio signal after the amplitude spectrum changing process and the phase spectrum changing process has been performed.

BRIEF DESCRIPTION OF THE ACCOMPANYING DRAWINGS

Figure 3A:
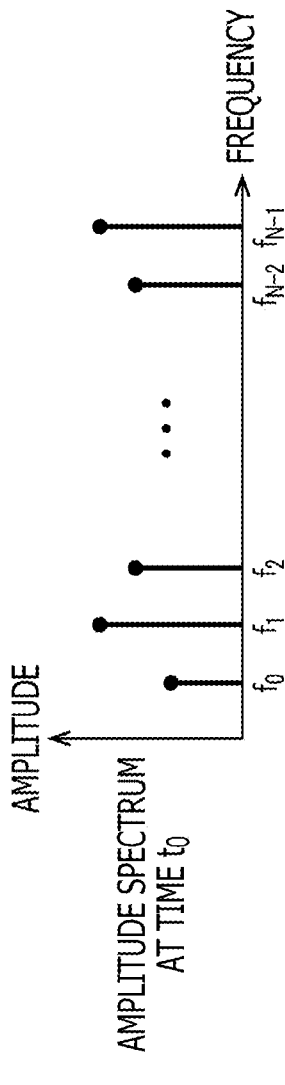
Figure 3B:
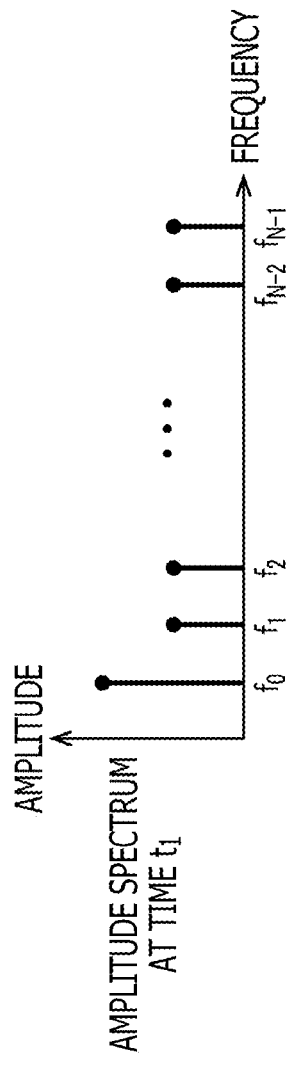
Figure 3C:
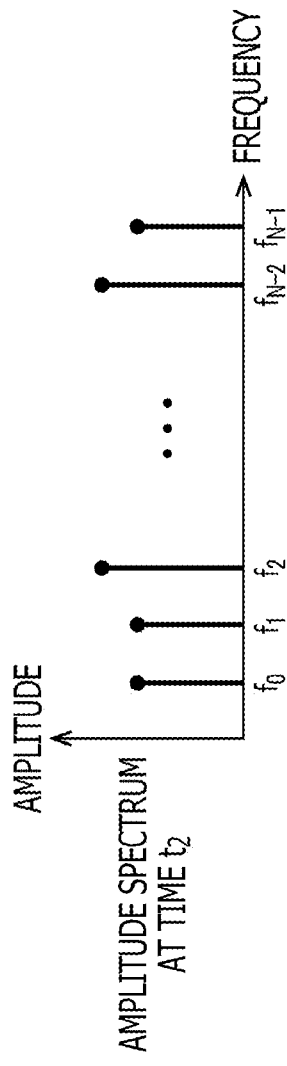
Figure 4A:
Figure 4B:
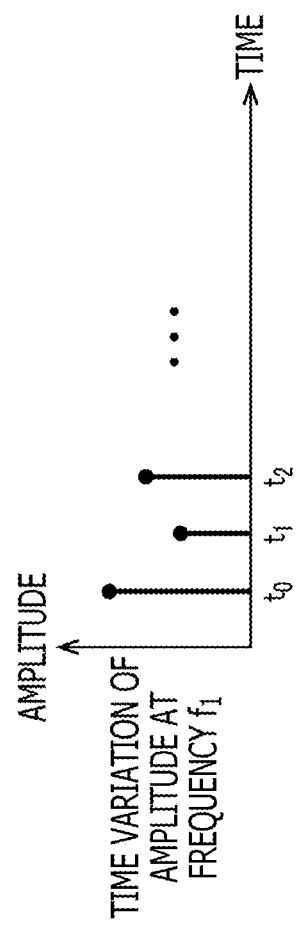
Figure 4C:
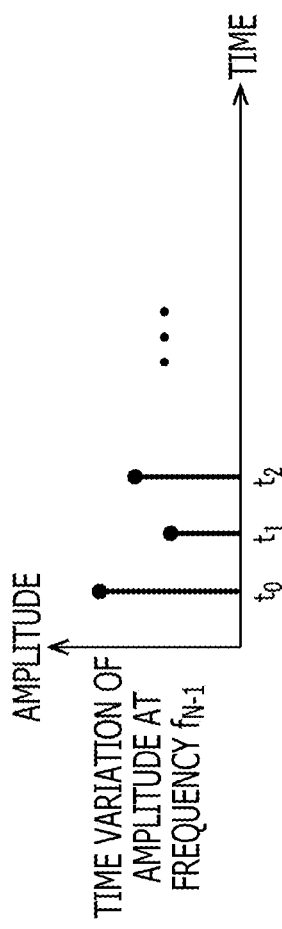

FIG. 3A is a graph showing amplitude spectrum at time $t_0$.
FIG. 3B is a graph showing amplitude spectrum at time $t_1$.
FIG. 3C is a graph showing amplitude spectrum at time $t_2$.
FIG. 4A is a graph showing time variation of amplitude of amplitude spectrum at frequency $f_0$.
FIG. 4B is a graph showing time variation of amplitude of amplitude spectrum at frequency $f_1$.
FIG. 4C is a graph showing time variation of amplitude of amplitude spectrum at frequency $f_2$.

Figure 5:
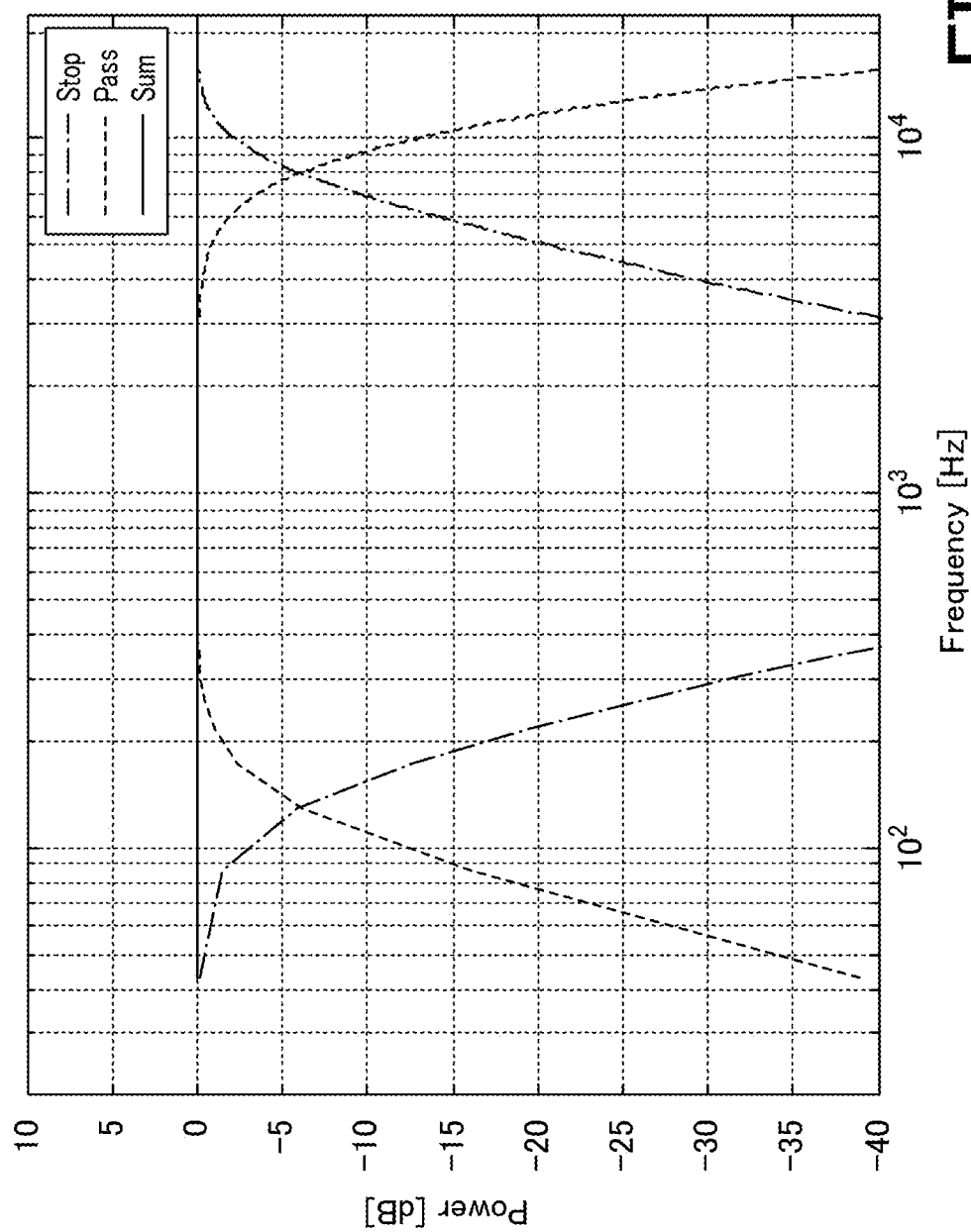

FIG. 5 is a diagram showing filter characteristics of a BPF (Band Pass Filter) and a BSF (Band Stop Filter) provided in the mixing apparatus according to an illustrative embodiment of the present disclosures.

Figure 6:
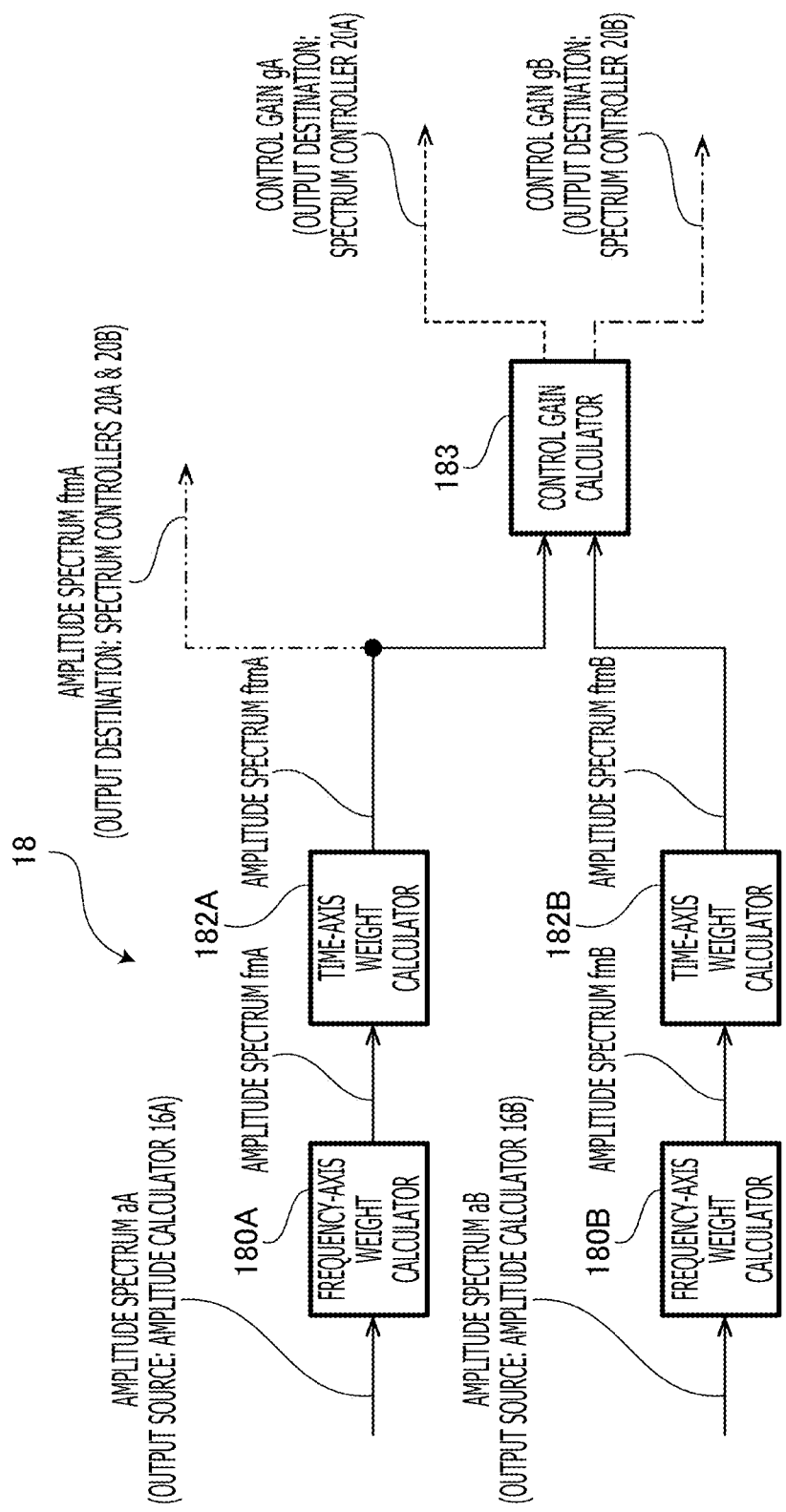

FIG. 6 is a block diagram showing a functional configuration of a weight calculator provided in the mixing apparatus according to an embodiment of the present disclosures.

Figure 7A:
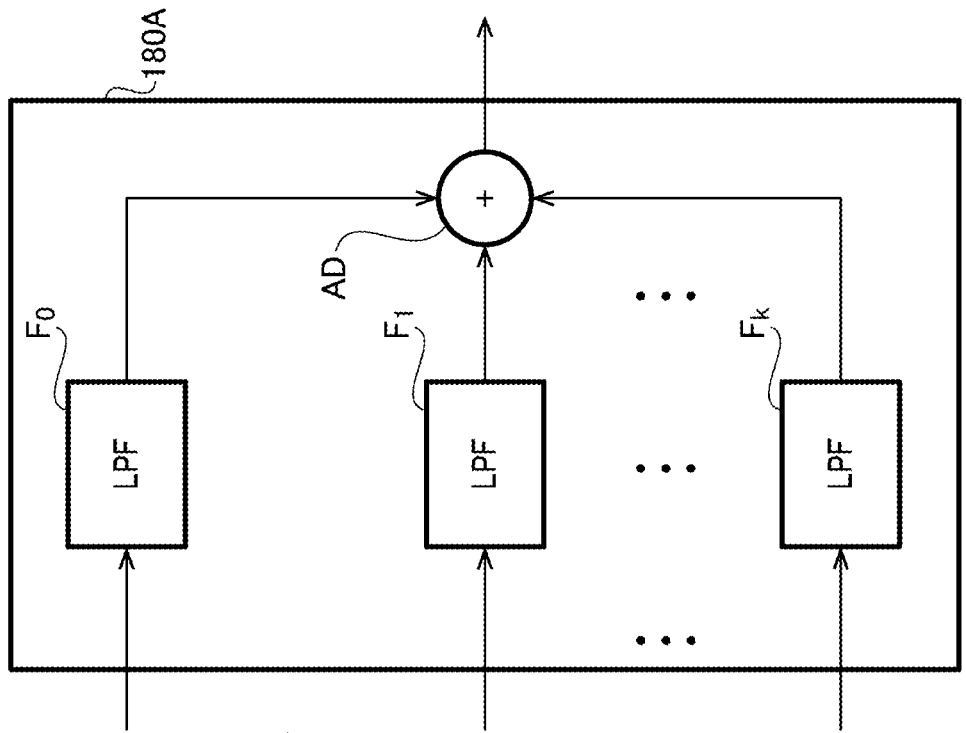

FIG. 7A is a diagram showing a configuration and an operation of a frequency-axis weight calculator provided in a weight calculator according to an illustrative embodiment of the present disclosures.

Figure 7B:
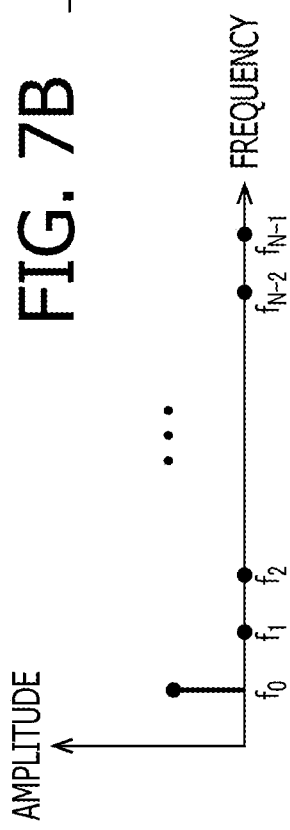

FIG. 7B is a graph showing an amplitude spectrum at time $t_0$ to be input to LPF $F_0$.

Figure 7C:
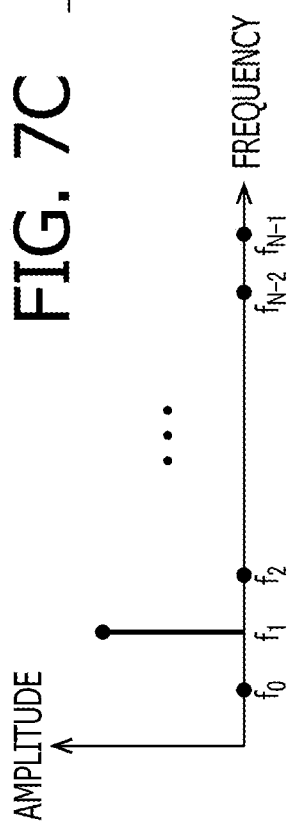

FIG. 7C is a graph showing an amplitude spectrum at time $t_0$ to be input to LPF $F_1$.

Figure 7D:
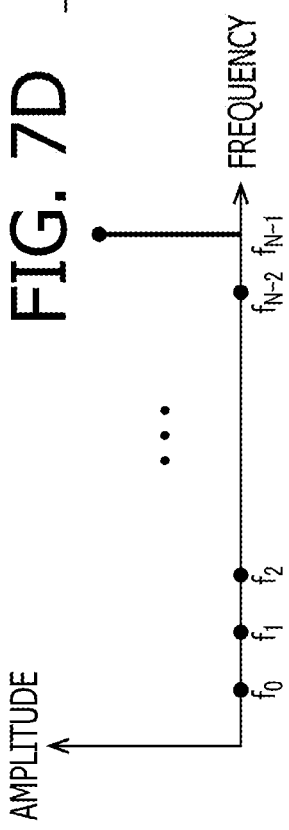

FIG. 7D is a graph showing an amplitude spectrum at time $t_0$ to be input to LPF $F_k$.

Figure 8:
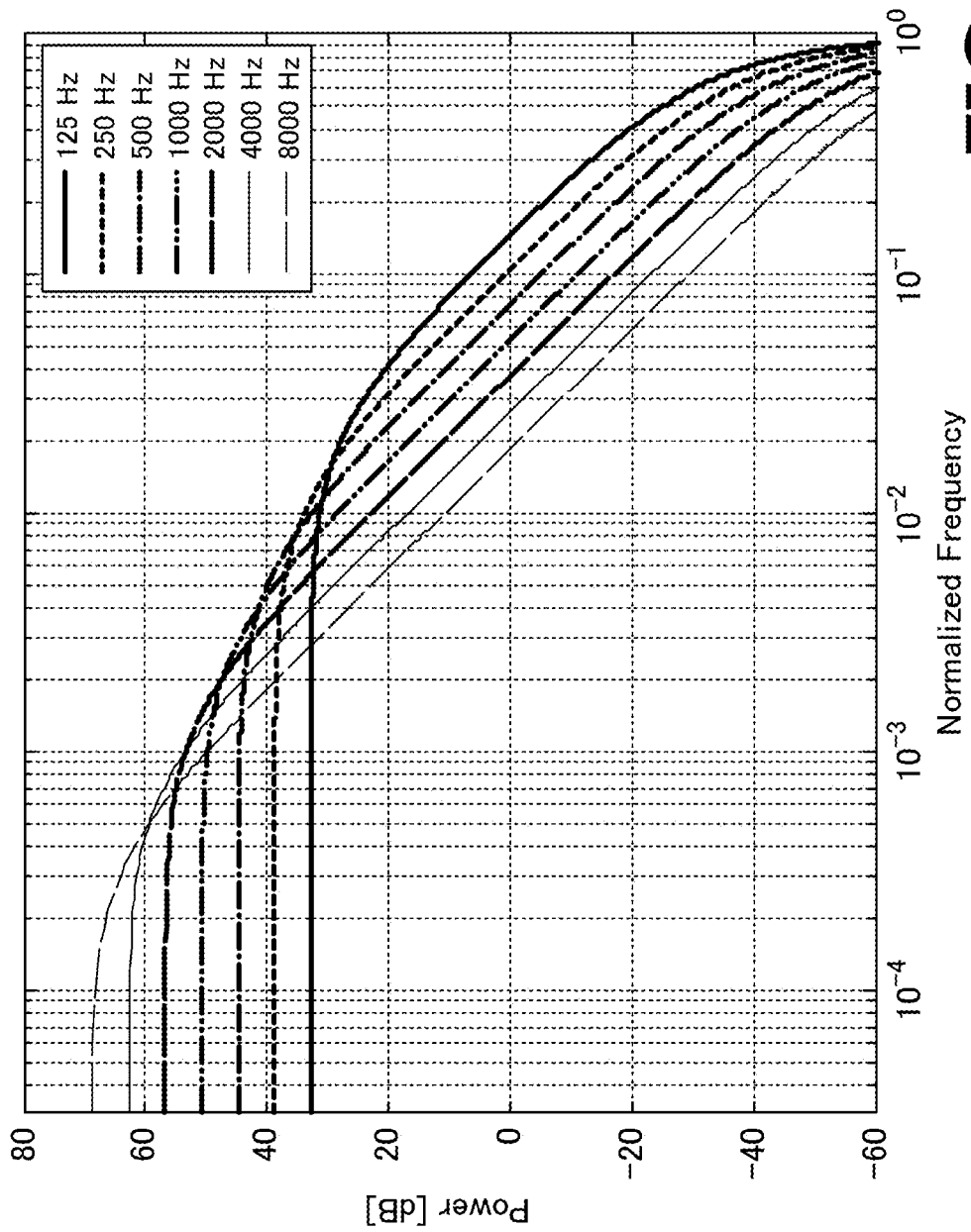

FIG. 8 is a diagram showing characteristic of each LPF (Low Pass Filter) provided in the frequency-axis weight calculator according to an illustrative embodiment of the present disclosures.

Figure 9:
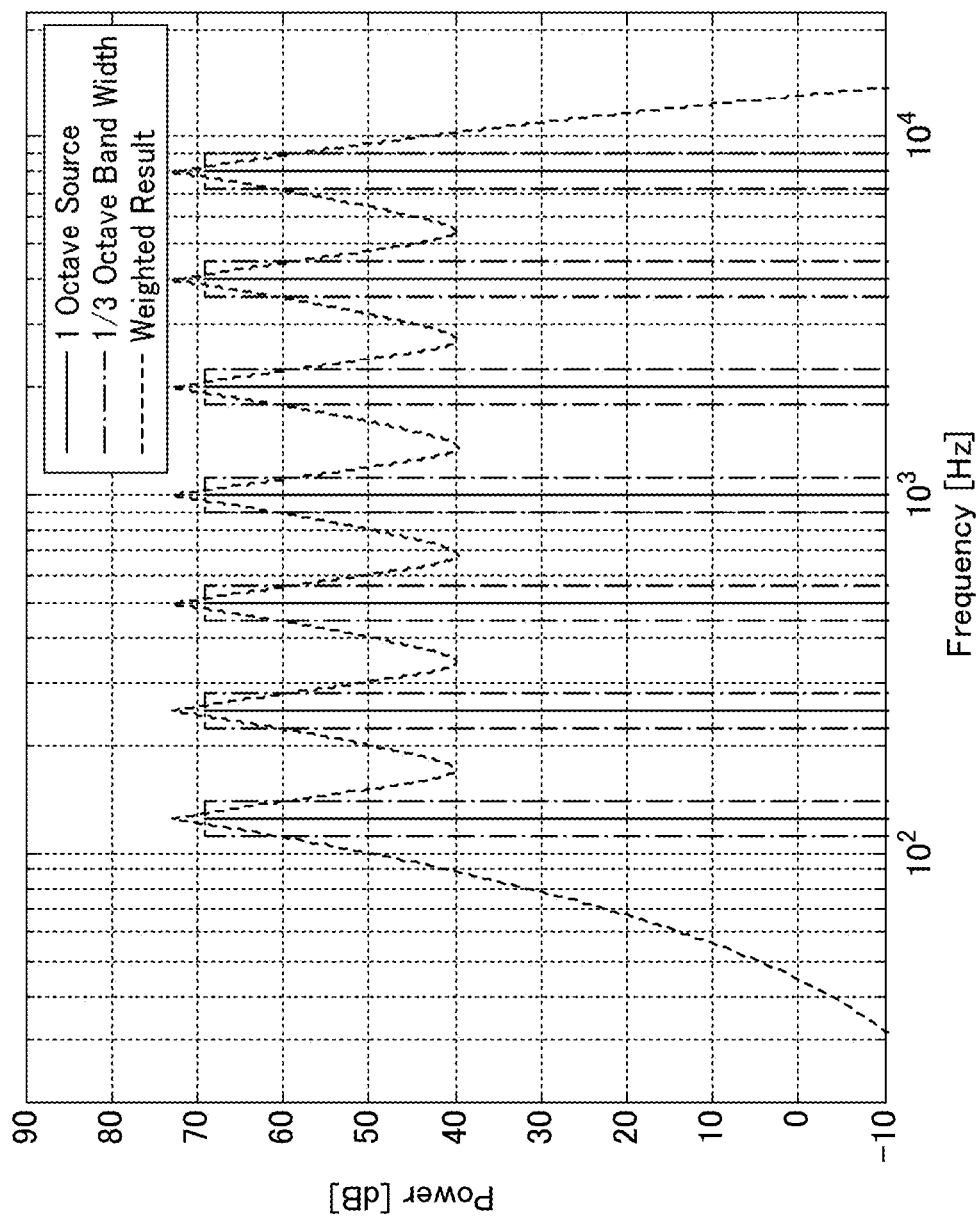

FIG. 9 is a diagram showing an amplitude spectrum obtained by weighting taking frequency masking into account, according to an illustrative embodiment of the present disclosures, for an amplitude spectrum of a sine wave having a plurality of frequency components.

Figure 10:
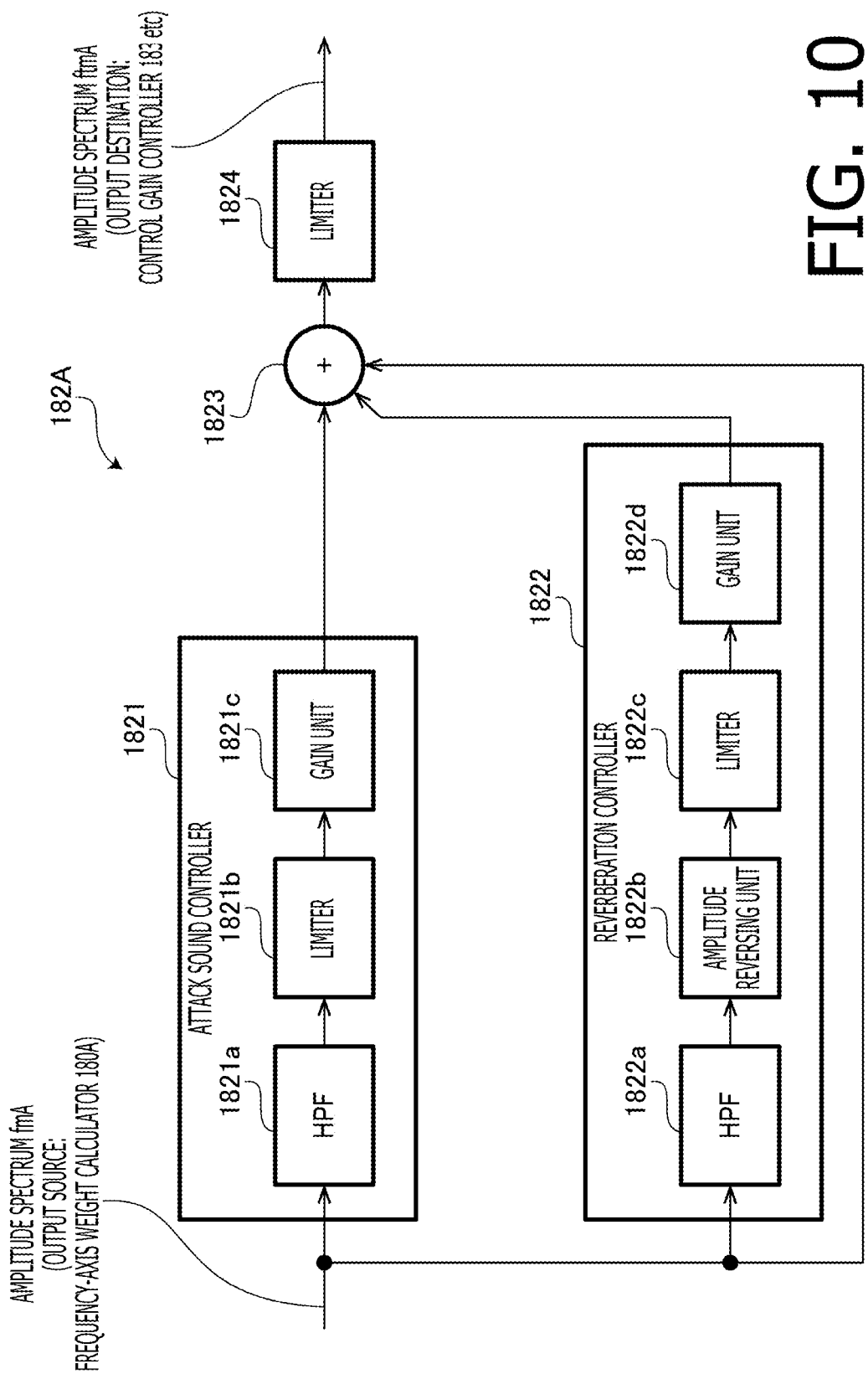

FIG. 10 is a block diagram showing a configuration of a time-axis weight calculator provided in the weight calculator according to an illustrative embodiment of the present disclosures.

FIG. 11A is a graph showing a function held by the control gain calculator provided in the weight calculator according to an illustrative embodiment of the present disclosures.

FIG. 11B is a graph showing a function held by the control gain calculator provided in the weight calculator according to an illustrative embodiment of the present disclosures.

Figure 12A:
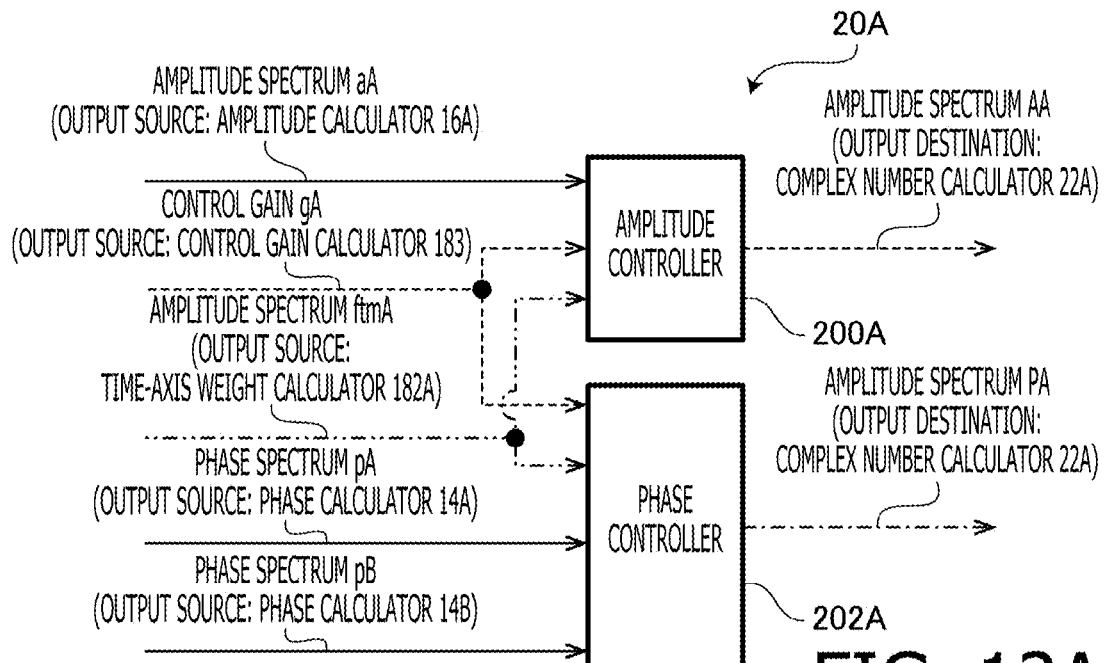

FIG. 12A is a block diagram showing a configuration of a spectrum controller included in the mixing apparatus according to an illustrative embodiment of the present disclosures.

Figure 12B:
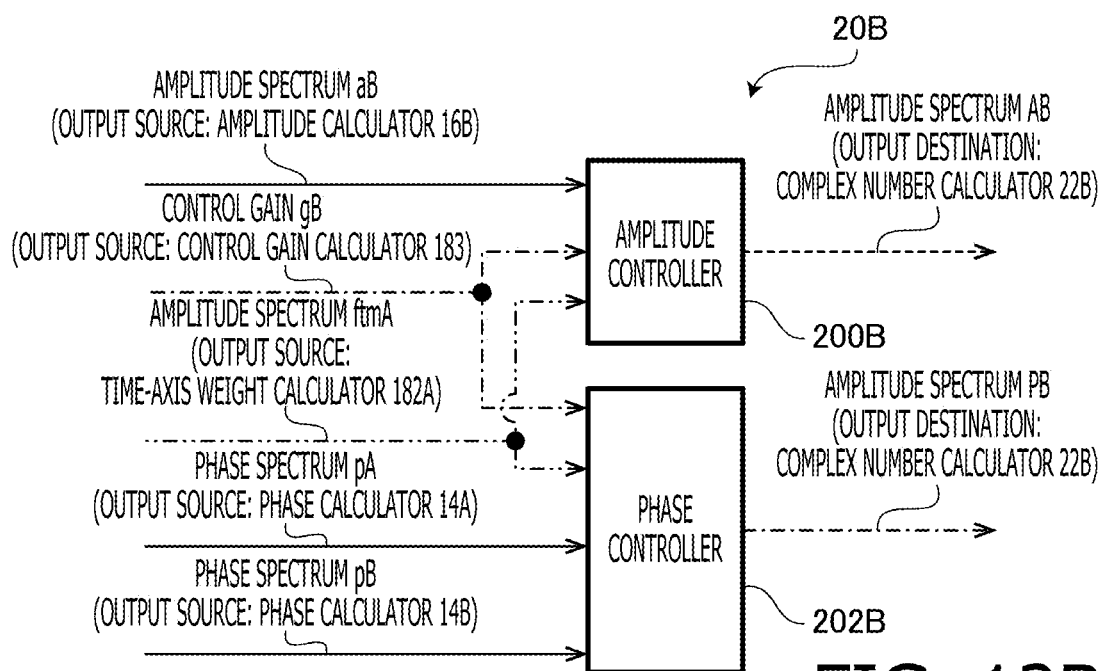

FIG. 12B is a block diagram showing a configuration of a spectrum controller included in the mixing apparatus according to an illustrative embodiment of the present disclosures.

FIG. 13A is a block diagram showing a configuration of an amplitude controller and a phase controller provided in the spectrum controller according to an illustrative embodiment of the present disclosures.

Figure 13B:
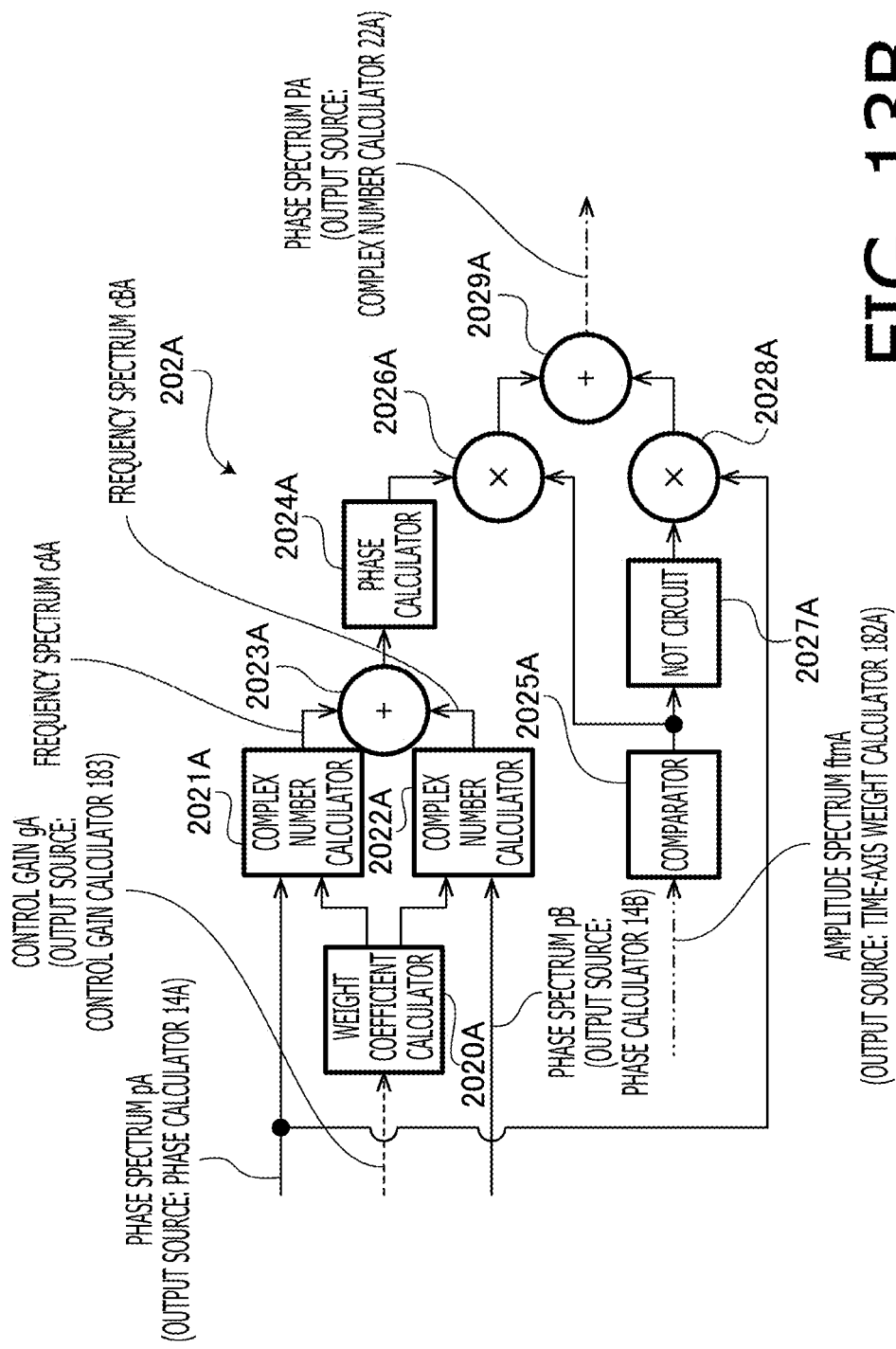

FIG. 13B is a block diagram showing a configuration of an amplitude controller and a phase controller provided in the spectrum controller according to an illustrative embodiment of the present disclosures.

FIG. 14A is a graph showing a function held by a weight coefficient calculator provided in the phase controller according to an illustrative embodiment of the present disclosures.

FIG. 14B is a graph showing a function held by a weight coefficient calculator provided in the phase controller according to an illustrative embodiment of the present disclosures.

Figure 15A:
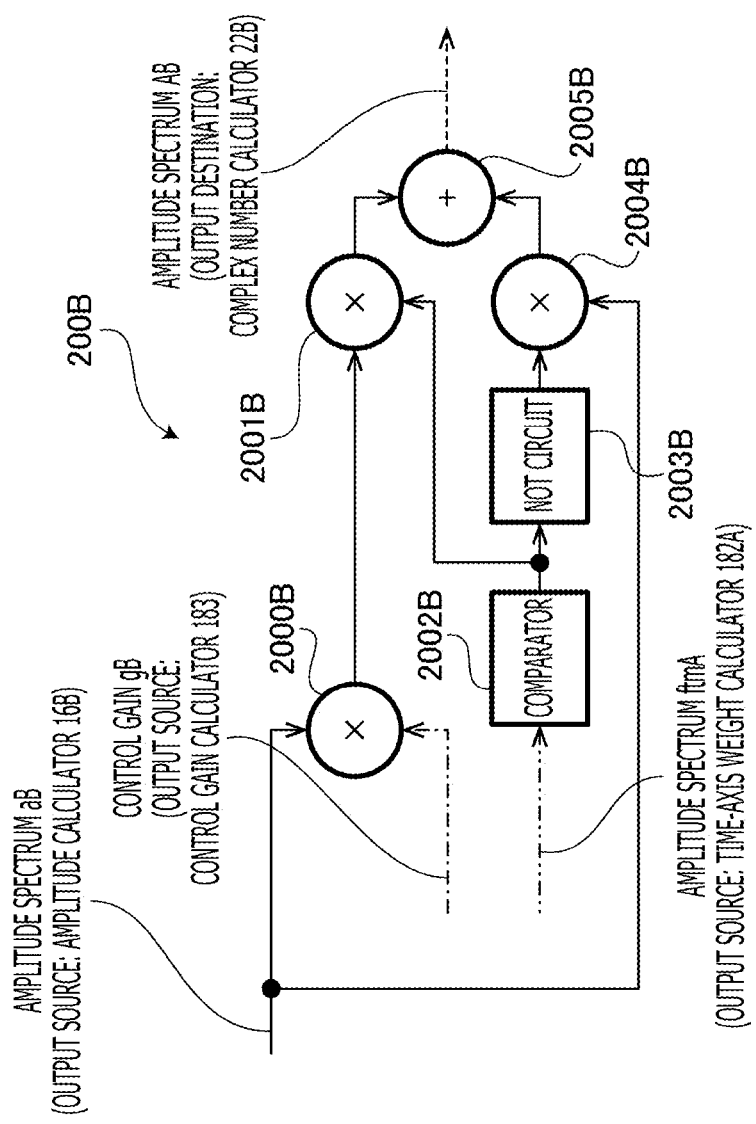

FIG. 15A is a block diagram showing a configuration of an amplitude controller and a phase controller provided in the spectrum controller according to an illustrative embodiment of the present disclosures.

Figure 15B:
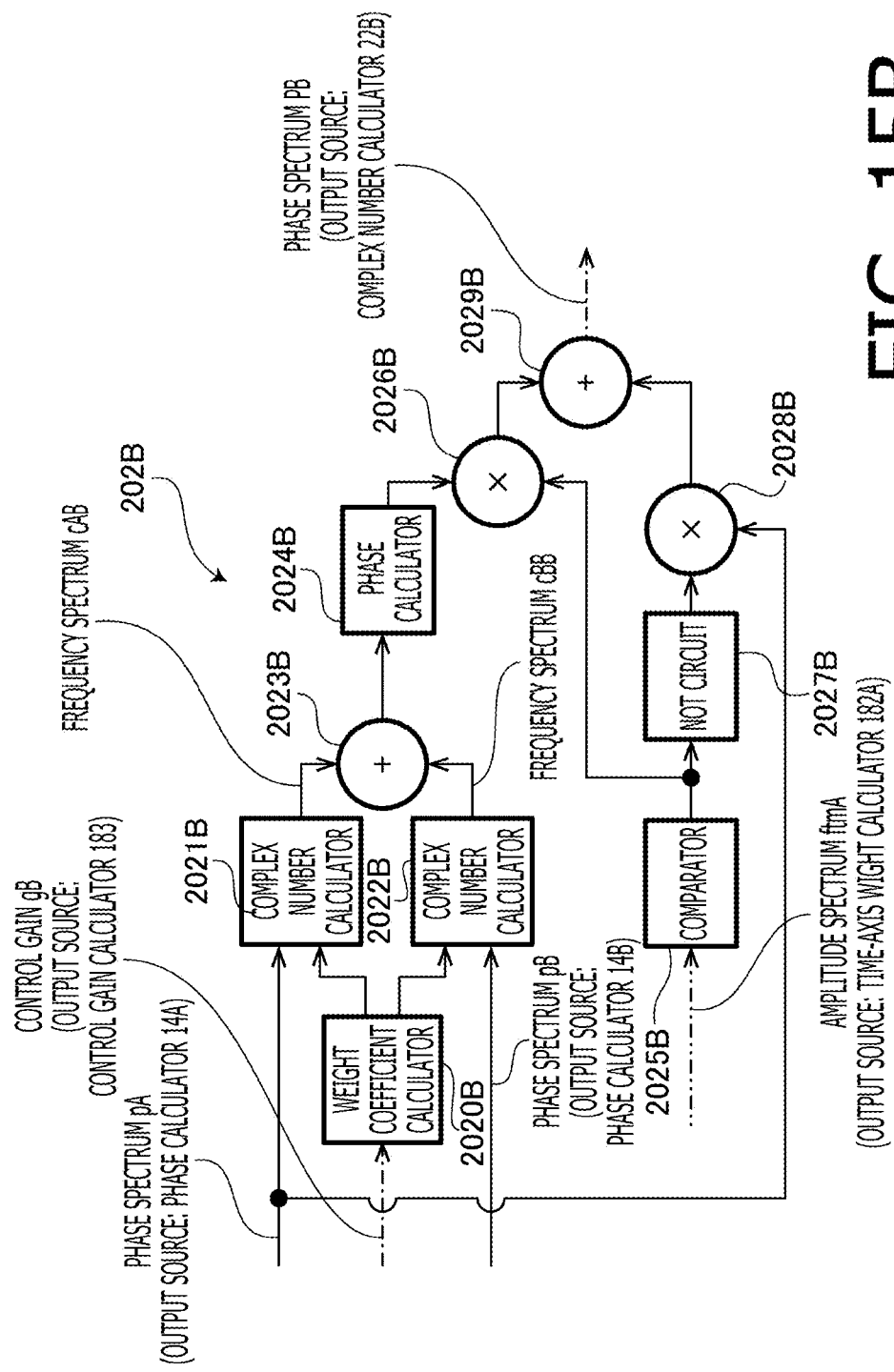

FIG. 15B is a block diagram showing a configuration of an amplitude controller and a phase controller provided in the spectrum controller according to an illustrative embodiment of the present disclosures.

FIG. 16A is a graph showing a function held by the weight coefficient calculator provided in the phase controller according to an illustrative embodiment of the present disclosures.

FIG. 16B is a graph showing a function held by the weight coefficient calculator provided in the phase controller according to an illustrative embodiment of the present disclosures.

FIG. 17A is a diagram showing an amplitude spectrum of the priority audio signal itself that is not subjected to the mixing process according to an illustrative embodiment of the present disclosures.

FIG. 17B is a diagram showing an amplitude spectrum of the priority audio signal subjected to the mixing process according to an illustrative embodiment of the present disclosures.

Figures 18A, 18B:
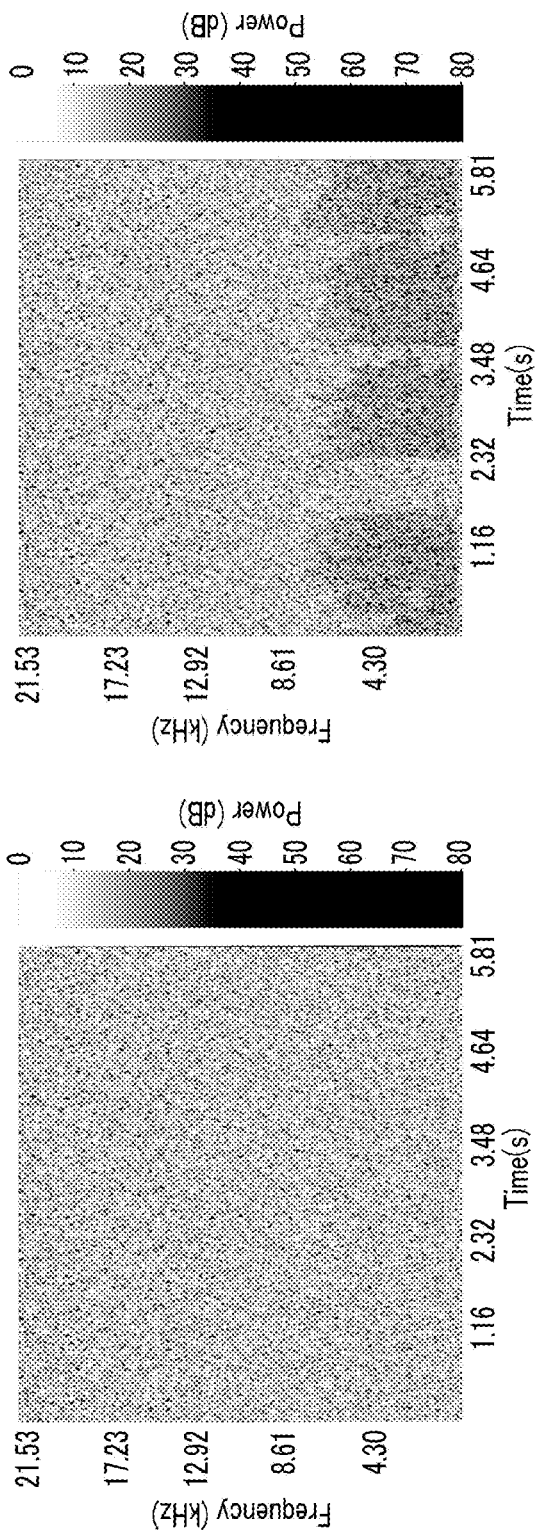

FIG. 18A, is a diagram showing an amplitude spectrum of a non-priority audio signal itself that is not subjected to the mixing process according to an illustrative embodiment of the present disclosures.

FIG. 18B is a diagram showing an amplitude spectrum of a non-priority audio signal subjected to the mixing according to an illustrative embodiment of the present disclosures.

Figure 19:
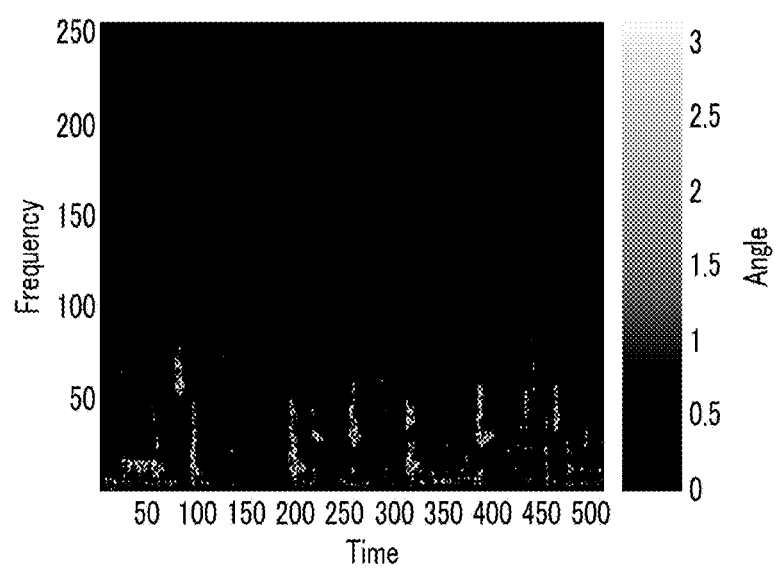

FIG. 19 is a diagram showing a difference between the phase spectrum of the non-priority audio signal itself that is not subjected to the mixing process according to an illustrative embodiment of the present disclosures and the phase spectrum of the non-priority audio signal subjected to the mixing process according to an illustrative embodiment of the present disclosures.

Figures 20A, 20B:
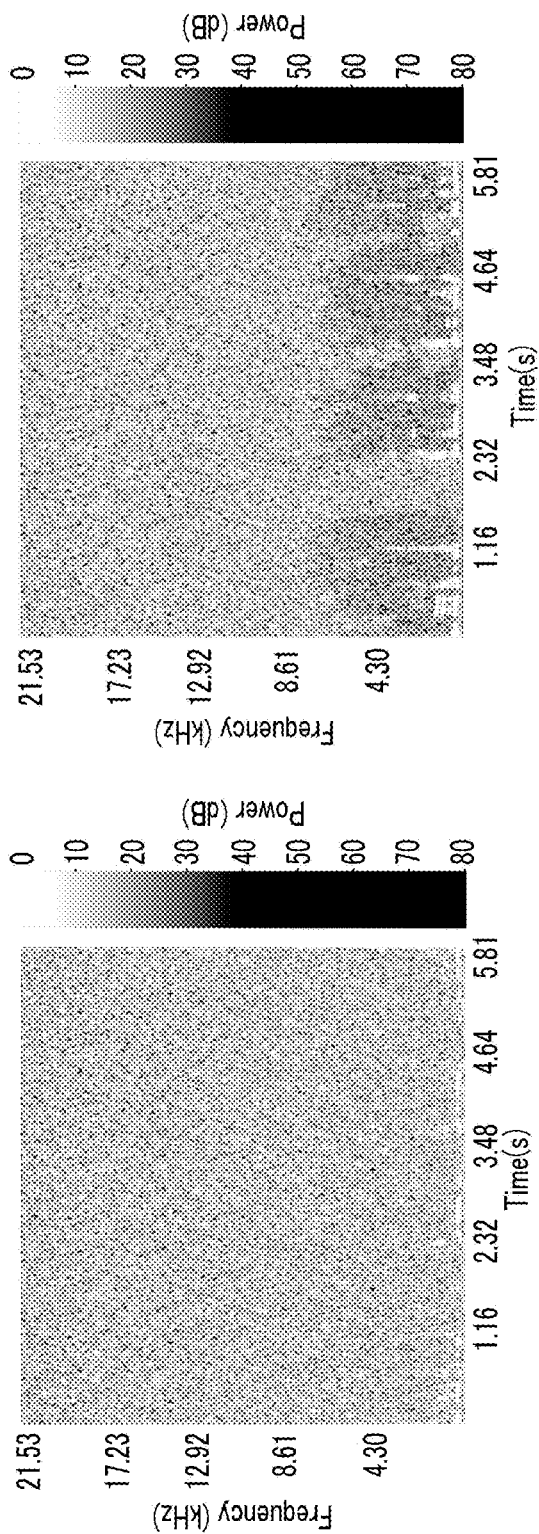

FIG. 20A is a diagram showing a mixing signal obtained by mixing the priority audio signal itself not subjected to the mixing process according to an illustrative embodiment of the present disclosures and the non-priority audio signal itself not subjected to the mixing process according to an illustrative embodiment of the present disclosures.

FIG. 20B is a diagram showing a mixing signal between the priority audio signal and the non-priority audio signal, which is outputted from an IFFT (Inverse Fast Fourier Transform) circuit provided in the mixing apparatus according to an illustrative embodiment of the present disclosures when amplitude amplification shown in FIG. 17B is performed on the priority audio signal, and amplitude attenuation shown in FIG. 18B and phase change shown in FIG. 19 are performed on the non-priority audio signal.

DETAILED DESCRIPTION OF THE EMBODIMENT

Illustrative Embodiments of the present disclosures will be described below with reference to the accompanying drawings. Hereinafter, a mixing apparatus mounted in a car will be described as an example of an embodiment of the present disclosures. It is noted that, the mixing apparatus according to the present disclosures is not limited to one mounted in a car.

Figure 1:
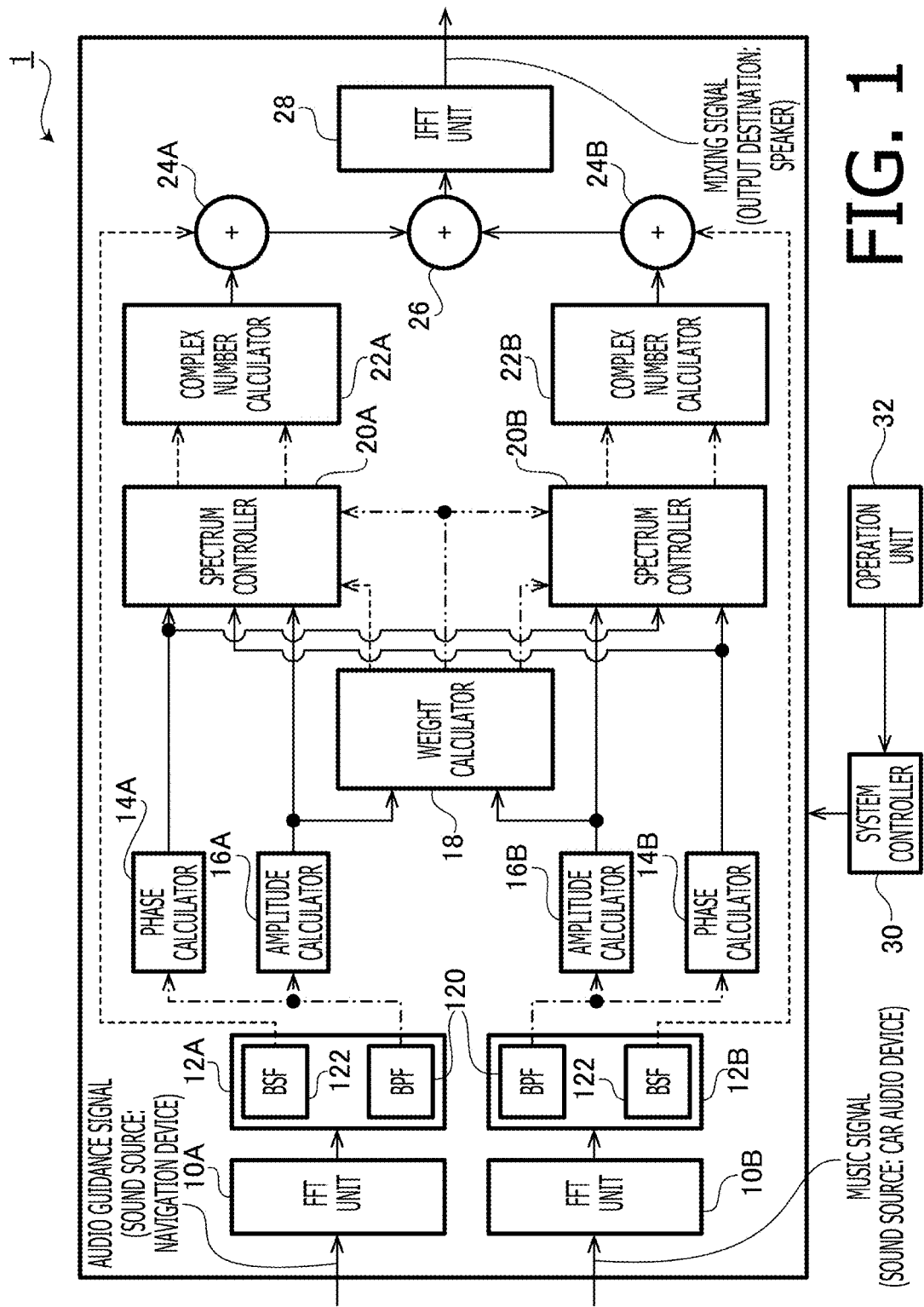
FIG. 1 is a block diagram showing a functional configuration of a mixing apparatus according to an illustrative embodiment of the present disclosures.

FIG. 1 is a block diagram showing a functional configuration of a mixing apparatus 1 according to an embodiment of the present disclosures. The mixing apparatus 1 is configured to mix a priority audio signal of a priority sound the apparatus attempts to make the listener listen to with a high priority and a non-priority audio signal of a non-priority sound having a priority lower than the priority of the priority audio signal. As shown in FIG. 1, the mixing apparatus 1 includes FFT circuits 10A, 10B, band dividers 12A, 12B, phase calculators 14A, 14B, amplitude calculators 16A, 16B, a weight calculator 18, spectrum controllers 20A, 20B, complex number calculators 22A, 22B, adders 24A, 24B, 26 and an IFFT circuit 28, a system controller 30 and an operation device 32. The priority sound and the non-priority sound are examples of a first sound and a second sound, respectively. The priority audio signal and the non-priority audio signal are examples of a first audio signal and a second audio signal, respectively. The mixing apparatus 1 is configured to mix the priority audio signal and the non-priority audio signal to enable a listener to listen to the priority sound in a more prioritized manner than the non-priority sound.

In the FFT circuits 10A and 10B, audio signals from different sound source circuits are input, respectively. According to the present embodiment, an audio signal (more particularly, an audio guidance signal) is input, in the FFT circuit 10A, from a navigation device (not shown), while a music signal is input, in the FFT circuit 10B, from a car audio device (not shown). Each of the navigation device and the car audio device is an example of the sound source circuit.

When the audio guidance signal is input from the navigation device, the mixing apparatus 1 mixes the audio guidance signal with the music signal and outputs the mixed signal to a speaker mounted in the car. As a result, the audio guidance is reproduced while the music is being played in the car. According to the present embodiment, when the audio guidance is reproduced while the music is being played in the car in this manner, masking of the audio guidance by the music can be suppressed, and audibility of the audio guidance can be ensured. In the following description, the audio guidance will be referred to as the "priority sound" and the music will be referred to as the "non-priority sound." Further, the audio guidance signal, which is the signal of the priority sound, will be referred to as "a priority audio signal," and the music signal, which is the signal of the non-priority sound, will be referred to as "a non-priority audio signal."

The system controller 30 is configured to determine the audio signal (i.e., the audio guidance signal) input from the navigation device as the priority audio signal, determine the audio signal (i.e., the music signal) input from the car audio device as the non-priority audio signal, and control each circuit of the mixing apparatus 1.

The system controller 30, for example, determines whether the audio signal is the priority audio signal or the non-priority audio signal based on a sound source circuit of the audio signal (in this embodiment, based on whether the sound source circuit is the navigation device or the car audio device). It is noted that the system controller 30 may be configured to determine whether the audio signal is the priority audio signal or the non-priority audio signal based on meta-information contained in the audio signal (e.g., based on information indicating whether the audio signal is the priority audio signal or the non-priority audio signal).

It should be noted the listener may be allowed to arbitrarily set the audio signals from which sound source circuits are the priority audio signal and the non-priority audio signal, respectively, by operating the operating device 32.

The FFT circuits 10A and 10B are configured to apply an overlapping process and a weighting process using a window function to the audio signals input from the respective sound source circuits. The FFT circuits 10A and 10B convert the audio signals, to which the overlapping process and the weighting process using the window function have been applied, from a time domain to a frequency domain by a short time Fourier transform processing, and output the converted signals to the band dividers 12A and 12B as frequency spectrums, respectively. That is, each of the FFT circuits 10A and 10B works as a first converter configured to overlap each of the priority audio signal and the non-priority audio signal and convert the overlapped signal into a frequency-domain signal.

Figure 2:
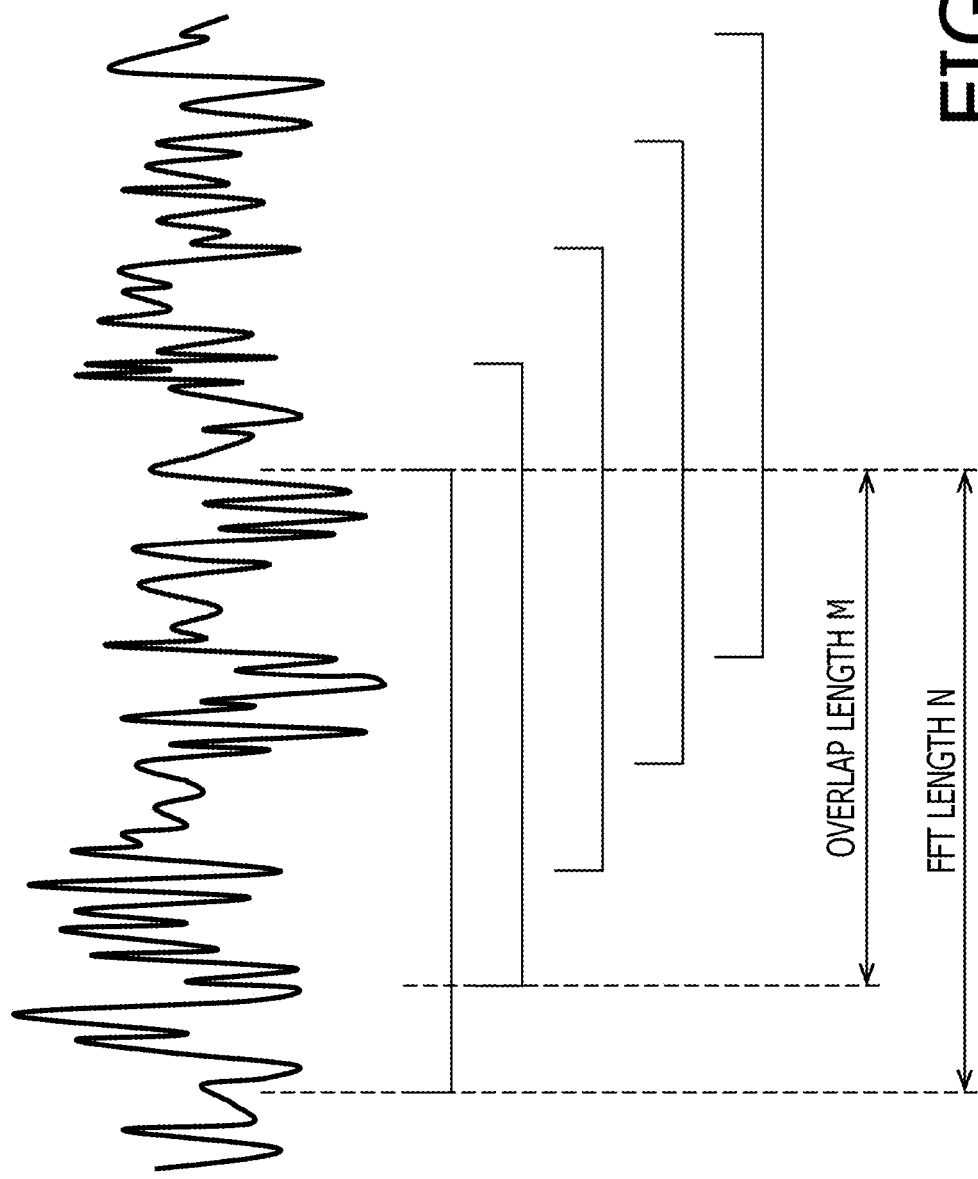
FIG. 2 is a diagram showing an audio signal input to an FFT (Fast Fourier Transform) circuit provided in the mixing apparatus according to an illustrative embodiment of the present disclosures, Fourier transform length N and overlap length M when a short time Fourier transform process for the audio signal is performed.

FIG. 2 is a diagram showing an audio signal input to the FFT circuit 10A or 10B, a Fourier transform length N and an overlap length M when performing the short time Fourier transform processing for this audio signal. It is noted that, in FIG. 2, the waveform indicates a waveform of the audio signal in a time domain and each solid line under the waveform indicates the Fourier transform length N. As shown in FIG. 2, the FFT circuit 10A or 10B performs the short time Fourier transform while shifting time by the difference time between the Fourier transform length N and the overlap length M. Thus, n frequency spectra whose time is shifted by the difference time are obtained.

FIGS. 3A-3C are graphs showing amplitude spectra for respective time shifts. FIG. 3A shows the amplitude spectrum at time $t_0$, FIG. 3B shows the amplitude spectrum at time $t_1$ and FIG. 3C shows the amplitude spectrum at time $t_2$. Each of FIGS. 3A-3C shows the amplitudes for respective frequencies (i.e., $f_0$, $f_1$, $f_2$, ..., $f_{N-2}$, $f_{N-1}$). In the case of the Fourier transform length N, the total number of amplitude spectra is N. Since the music signal and audio guidance signal are non-static signals, as shown in FIGS. 3A-3C, the amplitude spectrum fluctuates depending on the shift time.

FIGS. 4A-4C show the time variations of amplitudes of the amplitude spectra at respective frequencies when the amplitude spectra fluctuate depending on the shift time, FIG. 4A shows the time variation of the amplitude at the frequency $f_0$, FIG. 4B shows the time variation of the amplitude at the frequency $f_1$ and FIG. 4C shows the amplitude of the frequency $f_{N-1}$. Each of FIGS. 4A-4C shows the amplitude at each time ($t_0$, $t_1$, $t_2$, ...). The amplitude spectrum is sampled for the time shift interval and output as the frequency spectrum.

Each of the band dividers 12A and 12B includes a BPF 120 and a BSF 122, respectively. FIG. 5 shows the filtering characteristics of the BPF 120 and the BSF 122. In FIG. 5, the vertical axis represents power (unit: dB), and the horizontal axis represents frequency (unit: Hz). In FIG. 5, a broken line indicates a filter characteristic of the BPF 120, a dashed-dotted line indicates a filter characteristic of the BSF 122, and a solid line indicates a synthesizing characteristic of the filter characteristic of the BPF 120 and the filter characteristic of the BSF 122.

The BPF 120 is configured to pass only a signal with a frequency band to be controlled (hereinafter referred to as a "control target band") in a signal input from the FFT circuit 10A (or the FFT circuit 10B), and output the passing signal to both the phase calculator 14A and the amplitude calculator 16A (or both the phase calculator 14B and the amplitude calculator 169).

The BSF 122 is configured to stop a signal within control target band and pass a signal with a band other than the control target band in the signal input from the FFT circuit 10A (or the FFT circuit 10B), and output the passing signal to the adder 24A (or the adder 24B).

The control target band is a band of the priority audio signal. In the present embodiment, since the priority audio signal is the audio guidance signal, which is the signal of the human voice, 130 Hz to 8,000 Hz is set to the control target band.

When the listener changes the sound source circuit of the priority audio signal by operating the operating device 32, the control target band is set to a band of an audio signal of the sound source circuit after the changing. It is noted that the listener can arbitrarily change the control target band by operating the operation device 32.

The phase calculator 14A and the amplitude calculator 16A are configured to calculate a phase spectrum and an amplitude spectrum within the control target band, respectively, from the frequency spectrum within the control target band input from the band divider 12A. Hereinafter, for convenience of explanation, the phase spectrum within the control target band calculated by the phase calculator 14A will be referred to as a "phase spectrum pA," and the amplitude spectrum within the control target band calculated by the amplitude calculator 16A will be referred to as a "amplitude spectrum aA." The phase calculator 14A is configured to output the calculated phase spectrum pA within the control target band to each of the spectrum controllers 20A and 20B. The amplitude calculator 16A is configured to output the calculated amplitude spectrum aA within the control target band to the weight calculator 18 and the spectrum controller 20A.

The phase calculator 14B and the amplitude calculator 16B are configured to calculate a phase spectrum and a amplitude spectrum within the control target band, respectively, from the frequency spectrum within the control target band input from the band divider 12B. Hereinafter, for convenience of explanation, the phase spectrum within the control target band calculated by the phase calculator 14B will be referred to as a "phase spectrum pB," and the amplitude spectrum within the control target band calculated by the amplitude calculator 16B will be referred to as a "amplitude spectrum aB." The phase calculator 14B is configured to output the calculated phase spectrum pB within the control target band to the spectrum controller 20A and 20B. The amplitude calculator 16B is configured to output the calculated amplitude spectrum aB within the control target band to the weight calculator 18 and the spectrum controller 20B.

FIG. 6 is a block diagram showing a functional configuration of the weight calculator 18. As shown in FIG. 6, the weight calculator 18 includes frequency-axis weight calculators 180A and 180B, time-axis weight calculators 182A and 182B, and a control gain calculator 183.

The frequency-axis weight calculators 180A and 180B are configured to weight, while taking frequency masking into account, the amplitude spectra aA and aB within the control target band input from the amplitude calculators 16A and 16B, respectively. Specifically, the frequency-axis weight calculators 180A and 180B weight the amplitude spectra aA and aB, respectively, such that each of the amplitude spectra aA and aB simulates a range where the frequency masking is occurred between two sounds of the two sound source circuits.

FIGS. 7A-7D show a diagram illustrating a functional configuration and operation of the frequency-axis weight calculator 180A. FIG. 7A shows the functional configuration of the frequency-axis weight calculator 180A. Since the configuration of the frequency-axis weight calculator 180B is the same as that of the frequency-axis weight calculator 180A, a detailed description thereof is omitted.

As shown in FIG. 7A, the frequency-axis weight calculator 180A includes a plurality of LPFs ($F_0, F_1, \ldots, F_k$) and an adder AD. FIGS. 7B-7C show graphs indicating amplitude spectra to be input to the plurality of LPFs, respectively. In each LPF, the amplitude spectrum of each frequency within the control target band is input. FIGS. 7B-7C show the amplitude spectra at time $t_0$ of FIG. 3A as examples of the amplitude spectra to be input to the LPFs.

FIG. 8 shows the characteristics of respective LPFs provided by the frequency-axis weight calculator 180A. In FIG. 8, the vertical axis indicates the power (dB) and the horizontal axis indicates the normalized frequency (no unit). FIG. 8 shows, as examples, the characteristics of the LPFs applied to amplitude spectra which have different frequencies (125 Hz, 250 Hz, 500 Hz, 1,000 Hz, 2,000 Hz, 4,000 Hz, 8,000 Hz) by one octave, respectively.

Each LPF provided by the frequency-axis weight calculator 180A is configured to perform a low-pass filtering process on the amplitude spectrum input thereto and output it to the adder AD. The adder AD is configured to add up the amplitude spectra input from the respective LPFs (i.e., the amplitude spectra of respective frequencies after filtering). As a result of the amplitude spectra of respective frequencies after filtering being summed at the adder AD and, for the control target band, a weighted amplitude spectrum taking the frequency masking into account is obtained.

Hereinafter, for convenience of explanation, the signals output from the frequency-axis weight calculators 180A and 180B (i.e., the weighted amplitude spectrum taking the frequency masking into account) will be referred to as "amplitude spectrum fmA" and "amplitude spectrum fmB," respectively.

In general, when filtering is applied to a signal of the frequency spectrum, some frequency components are output with non-uniform delays. In the present embodiment, when the amplitude spectrum passing through each LPF is non-uniformly delayed, the amplitude spectrum within the control target band obtained by the adder AD adding the plurality of the amplitude spectra does not become smooth as a whole. Therefore, in the embodiments of the disclosures, LPFs which do not cause phase distortion (i.e., delay does not occur) is used for the frequency-axis weight calculator 180A.

FIG. 9 shows the amplitude spectrum fmA obtained by weighting the amplitude spectrum of a sine wave having frequency components of 125 Hz, 250 Hz, 500 Hz, 1,000 Hz, 2,000 Hz, 4,000 Hz and 8,000 Hz by the frequency-axis weighting calculator 180A taking the frequency masking into account. In FIG. 9, the vertical axis represents the power (dB), and the horizontal axis represents the frequency (unit: Hz). Further, in FIG. 9, the solid lines indicate the line spectra (i.e., the frequency components) contained in the sine wave, respectively, the dashed line indicates the amplitude spectrum fmA, and the dashed-dotted lines indicate the ⅓ octave bandwidths centered on respective line spectra.

In the example of FIG. 9, by signal processing in the frequency-axis weight calculator 180A, a shape of each frequency component included in the sine wave is converted into a spectral shape having width (i.e., a spectral shape having about a ⅓ octave bandwidth). This shape (i.e., the shape of the amplitude spectrum fmA) is a shape similar to an auditory filter of a human. Further, this shape simulates a range in which the sound of a sine wave masks other sounds on the frequency axis (i.e., other sounds having frequencies different from that of the sine wave), and the higher the frequency, the wider the bandwidth of the range. Thus, it can be seen that, in the frequency-axis weight calculator 180A, the weighting taking the frequency masking into account is applied to the amplitude spectrum aA within the control target band.

The time-axis weight calculators 182A and 182B are configured to weight, while taking the time masking int account, the amplitude spectra fmA and fmB input from the frequency-axis weight calculators 180A and 180B, respectively. Specifically, the time-axis weight calculators 182A and 182B weight the amplitude spectra fmA and fmB, respectively, such that each of the amplitude spectra fmA and fmB simulates a range where the time masking is occurred between two sounds of the two sound source circuits.

Hereinafter, for convenience of explanation, signals output from the time-axis weight calculators 182A and 182B (i.e., amplitude spectra weighted taking the time masking into account in addition to frequency masking) will be referred to as an "amplitude spectrum ftmA" and an "amplitude spectrum ftmB," respectively.

The weighting taking the time masking into account can be performed using a conventional technique, for example, described in US 2015-030171 A1, teachings of the application being incorporated herein by reference. FIG. 10 shows a functional configuration of the time-axis weight calculator 182A configured by applying the technique described in this patent. Since the configuration of the time-axis weight calculator 182B is the same as that of the time-axis weight calculator 182A, a detailed description thereof will be omitted.

As shown in FIG. 10, the time-axis weight calculator 182A includes an attack sound controller 1821, a reverberation controller 1822, an adder 1823 and a limiter 1824.

Into each of the attack sound controller 1821 and the reverberation controller 1822, the amplitude spectrum fmA is input from the frequency-axis weight calculator 180A.

As shown in FIG. 10, the attack sound controller 1821 includes an HPF (High Pass Filter) 1821a, a limiter 1821b and a gain circuit 1821c.

The HPF 1821a is configured to perform a high-pass filtering process, for each amplitude spectrum, to the input amplitude spectrum fmA. The limiter 1821b sets the amplitude of a negative side of the high-pass filtered amplitude spectrum to zero. By setting the amplitude of the negative side to zero, it is possible to detect a rising component of the signal for each amplitude spectrum, that is, the attack component (attack sound).

According to the present embodiment, the higher the cutoff frequency set in the HPF 1821a, the shorter control time of the attack sound. In other words, the lower this value, the longer the control time of the attack sound. The cutoff frequency is set based on, for example, the sound source circuit of the audio signal and the band of the audio signal estimated from the sound source circuit (e.g., the band of the human voice if the sound source circuit is the navigation device), The cutoff frequency can be arbitrarily set by the listener operating the operation device 32.

The gain circuit 1821c is configured to perform weighting of the attack component of the amplitude spectrum detected by the limiter 1821b, and output the amplitude spectrum to the adder 1823.

In the adder 1823, in addition to the amplitude spectrum fmA to which the weighting of the attack component is performed, the amplitude spectrum fmA to which the weighting is not performed is input from the frequency-axis weight calculator 180A. The adder 1823 adds up these amplitude spectra. As a result, when a weight amount of the attack component is a positive value, the attack sound of the amplitude spectrum fmA is enhanced, and when the weight amount is a negative value, the attack sound is reduced. That is, the greater the positive value of the weighting amount, the more the attack sound is enhanced, and the greater the negative value of the weighting amount, the more the attack sound is reduced.

The value of the weighting amount of the attack sound is set to, for example, −1 or more and +1 or less. The value of the weighting amount is set, for example, based on the sound source circuit of the audio signal and the band of the audio signal presumed from the sound source circuit. The value of the weighting amount can be arbitrarily set by the listener operating the operation device 32.

As shown in FIG. 10, the reverberation controller 1822 includes an HPF 1822a, an amplitude inverter 1822b, a limiter 1822c and a gain circuit 1822d.

The HPF 1822a is configured to perform a high-pass filtering process, for each amplitude spectrum, to the input amplitude spectrum fmA. The amplitude inverter 1822b multiplies the high-pass filtered amplitude spectrum at HPF 1822a by −1 to invert its amplitude.

The limiter 1822c is configured to set the amplitude of a negative side of the amplitude spectrum after amplitude inversion to zero, By setting the amplitude of the negative side to zero, it is possible to detect the falling component of the signal for each amplitude spectrum, i.e., the reverberation component (reverberation) sustained after the attack sound.

The higher the value of the cutoff frequency set in the HPF 1822a, the shorter the control time of the reverberation. In other words, the lower this value, the longer the control time of the reverberation. The cutoff frequency is set, for example, based on the sound source circuit of the audio signal and the band of the audio signal presumed from the sound source circuit. The cutoff frequency can be arbitrarily set by the listener operating the operation device 32.

The gain circuit 1822d is configured to perform weighting of the reverberant component of the amplitude spectrum detected by the limiter 1822c, and output the amplitude spectrum to the adder 1823.

In the adder 1823, in addition to the amplitude spectrum fmA to which the weighting of the reverberant component is performed, the amplitude spectrum fmA to which the weighting is not performed is input from the frequency-axis weight calculator 180A. The adder 1823 is configured to add up these amplitude spectra. As a result, when the weighted amount of the reverberant component is a positive value, the reverberant is enhanced with respect to the amplitude spectrum fmA, and when the weighted amount is a negative value, the reverberant is reduced. That is, the larger the positive value of the weighting amount, the more the reverberant is enhanced, and the larger the negative value of the weighting amount, the more the reverberant is reduced.

The value of the weighting amount of the reverberant is set to, for example, a value of −1 or more and +1 or less. The value of this weighting amount is set, for example, based on the sound source circuit of the audio signal and the band of the audio signal presumed from the sound source circuit, etc. The value of the weighting amount can be arbitrarily set by the listener operating on the operation device 32.

The adder 1823 is configured to add, to the amplitude spectrum fmA, the amplitude spectrum to which the weighting of the attack component is performed and the amplitude spectrum to which the weighting of the reverberation component is performed to obtain an amplitude spectrum in which the attack sound and the reverberation are enhanced or reduced, and output the obtained amplitude spectrum to the limiter 1824.

The limiter 1824 is configured to set the amplitude of a negative side of the amplitude spectrum input from the adder 1823 to zero, and output the amplitude spectrum (i.e., the amplitude spectrum ftmA weighted taking the frequency masking and the time masking into account) to each of the control gain calculator 183 and the spectrum controllers 20A, 20B. It is noted that the time-axis weight calculator 182B outputs the amplitude spectrum ftmB only to the control gain calculator 183.

Thus, the time-axis weight calculator 182A can adjust duration of the rising component (i.e., the attack component) and duration of the falling component (i.e., the reverberant component) of the audio signal (i.e., the priority audio signal in the time-axis weight calculator 182A) by changing the amplitude spectrum fmA input from the frequency-axis weight calculator 180A (more particularly, the amplitude spectra fmA of n frequency spectra obtained by the FFT circuit 10A) in accordance with the cutoff frequencies of the HPF 1821a and the HPF 1822a and the weighting amount of the attack sound and the reverberation.

As an example, the time-axis weight calculator 182B can simulate a range in which the music masks the audio guidance on the time axis by extending the duration of the falling component of the non-priority audio signal. Thus, it can be seen that the time-axis weight calculators 182A and 182B weight the amplitude spectra within the control target band taking the time masking into account, respectively.

According to the present embodiment, in order to obtain effect of suppressing the masking of the audio guidance by the music to ensure the audibility of the audio guidance, the amplitude spectra aA and aB within the control target band are weighted taking both the frequency masking and the time masking. In another embodiment, in order to obtain this effect, one or both of the amplitude spectra aA and aB within the control target band may be weighted taking only one of the frequency masking and the time masking into account. In such an embodiment, the same effect can be obtained (however, a higher effect will be obtained by weighting both the amplitude spectra aA and aB within the control target band taking both the frequency masking and the time masking into account).

As described above, the weight calculator 18 operates as a weighting circuit that performs weighting, while taking at least one of the frequency masking and the time masking into account, with respect to at least one of the amplitude spectra aA and aB within the control target band. More specifically, the frequency-axis weight calculators 180A and 180B perform, weighting taking the frequency masking into account, to widen the shape of the amplitude spectra aA and aB within the control target band, respectively, such that each shape simulates a range in which a sound having the amplitude spectrum aA or aB masks other sounds on the frequency axis. In addition, the frequency-axis weight calculators 180A and 180B weight the amplitude spectra aA and aB within the control target band, respectively, in order to further widen bandwidths as the frequency is higher. In addition, the time-axis weight calculators 182A and 182B widen the shape of the amplitude spectra aA and aB within the control target band, respectively, by weighting taking the time masking into account such that each shape simulates a range in which a sound having the amplitude spectrum aA or aB masks other sounds on the time axis.

FIGS. 11A and 11B show functions that the control gain calculator 183 holds. As shown in FIGS. 11A and 11B, the control gain calculator 183 holds a first gain function and a second gain function. The control gain calculator 183 is configured to calculate, for each frequency, an amplitude ratio between the amplitude spectrum ftmA input from the time-axis weight calculator 182A and the amplitude spectrum ftmB input from the time-axis weight calculator 182B. Then the control gain calculator 183 inputs the calculated amplitude ratio to the first gain function to obtain a control gain gA for the priority audio signal, and also inputs the amplitude ratio to the second gain function to obtain a control gain gB for the non-priority audio signal. The control gain calculator 183 outputs the control gain gA to the spectrum controller 20A, and outputs the control gain gB to the spectrum controller 20B.

That is, the control gain calculator 183 operates as a calculator for calculating a particular control value based on the amplitude ratio in the control target band between the priority audio signal and the non-priority audio signal after the weighting process.

According to the first gain function and the second gain function, as the level of the priority audio signal becomes lower than the level of the non-priority audio signal, the control gain gA becomes higher and the control gain gB becomes lower. In other words, as the level of the priority audio signal becomes higher than the level of the non-priority audio signal, the control gain gA becomes lower and the control gain gB becomes higher. It is noted that the control gain gA is a positive gain, and the control gain gB is a negative gain.

FIGS. 12A and 12B are block diagrams showing functional configurations of the spectrum controllers 20A and 20B, respectively. As shown in FIG. 12A, the spectrum controller 20A includes an amplitude controller 200A and a phase controller 202A. As shown in FIG. 12B, the spectrum controller 20B includes an amplitude controller 200B and a phase controller 202B.

In the amplitude controller 200A, the amplitude spectrum aA is input from the amplitude calculator 16A, the amplitude spectrum ftmA is input from the time-axis weight calculator 182A, and the control gain gA is input from the control gain calculator 183. In the phase controller 202A, the phase spectra pA and pB are input from the phase calculators 14A and 14B, respectively, the amplitude spectrum ftmA is input from the time-axis weight calculator 182A, and the control gain gA is input from the control gain calculator 183.

In the amplitude controller 200B, the amplitude spectrum aB is input from the amplitude calculator 16B, the amplitude spectrum ftmA is input from the time-axis weight calculator 182A, and the control gain gB is input from the control gain calculator 183. In the phase controller 202B, the phase spectra pA and pB are input from the phase calculator 14A and 14B, respectively, the amplitude spectrum ftmA is input from the time-axis weight calculator 182A, and the control gain gB is input from the control gain calculator 183.

FIGS. 13A and 13B show a block diagrams of the amplitude controller 200A and the phase controller 202A, respectively.

As shown in FIG. 13A, the amplitude controller 200A includes multipliers 2000A and 2001A, a comparator 2002A, a NOT circuit 2003A, a multiplier 2004A and an adder 2005A.

The multiplier 2000A is configured to multiply the amplitude spectrum aA input from the amplitude calculator 16A by the control gain gA input from the control gain calculator 183, and output the multiplied amplitude spectrum aA to the multiplier 2001A.

The comparator 2002A is configured to compare the amplitude spectrum ftmA input from the time-axis weight calculator 182A to a threshold K, and output 1 when the amplitude spectrum ftmA is greater than the threshold K, and output 0 when the amplitude spectrum ftmA is equal to or less than the threshold K.

The multiplier 2001A is configured to multiply the amplitude spectrum input from the multiplier 2000A by the output from the comparator 2002A (i.e., 0 or 1) and output the multiplication result to the adder 2005A. That is, the multiplier 2001A outputs the amplitude spectrum aA multiplied by the control gain gA to the adder 2005A only when the amplitude spectrum ftmA is greater than the threshold K.

The multiplier 2004A is configured to multiply the amplitude spectrum aA input from the amplitude calculator 16A by the output of the NOT circuit 2003A (i.e., the inverted output of the comparator 2002A) and outputs the multiplication result to the adder 2005A. That is, the multiplier 2004A outputs the amplitude spectrum aA not multiplied by the control gain gA to the adder 2005A only when the amplitude spectrum ftmA is equal to or smaller than the threshold K.

The adder 2005A is configured to add up the amplitude spectrum input from the multiplier 2001A and the amplitude spectrum input from the multiplier 2004A and output the addition result to the complex number calculator 22A.

That is, the amplitude controller 200A amplifies the amplitude spectrum aA input from the amplitude calculator 16A by multiplying with the control gain gA only in a hand in which the amplitude spectrum ftmA is larger than the threshold K, and outputs the amplified spectrum aA to the complex number calculator 22A. Hereinafter, for convenience of description, the amplitude spectrum output to the complex number calculator 22A will be referred to as "amplitude spectrum AA."

According to the present embodiment, an originally low power band of the audio guidance (specifically, a band in which amplitude spectrum ftmA is equal to or lower than the threshold K) is considered to be a band of a sound components that are substantially acceptable for a listener even if the listener cannot listen to them, and the amplitude spectrum aA is not amplified by the control gain gA. In another embodiment, whole the control target band of the audio guidance may be amplified with the control gain gA.

Thus, the amplitude controller 200A amplifies the amplitude of the priority audio signal and suppresses masking of the priority sound by the non-priority sound by performing the multiplying process using a control gain gA (i.e., a parameter that takes a value corresponding to the amplitude ratio of the amplitude spectrum ftmA and the amplitude spectrum ftmB which are weighted taking the frequency masking and the time masking into account). However, in order to avoid a situation in which the non-priority sound becomes difficult to be listened to by amplifying the amplitude of the priority audio signal, the amplitude controller 200A does not excessively amplify the amplitude of the priority audio signal while limiting the band in whish amplifying is performed to the control target band. Illustratively, the amplitude controller 200A does not amplify the amplitude of the priority audio signal when the amplitude spectral ftmA is fully larger than the amplitude spectral ftmB.

As shown in FIG. 13B, the phase controller 202A includes a weight coefficient calculator 2020A, complex number calculators 2021A and 2022A, an adder 2023A, a phase calculator 2024A, a comparator 2025A, a multiplier 2026A, a NOT circuit 2027A, a multiplier 2028A and an adder 2029A.

FIGS. 14A and 14B show functions held by the weight coefficient calculator 2020A. As shown in FIGS. 14A and 14B, the weight coefficient calculator 2020A holds a weight function 1A and a weight function 2A. The weight coefficient calculator 2020A is configured to input the control gain gA from the control gain calculator 183 to each of the weight function 1A and the weight function 2A to calculate the weight coefficients mA and nA, and output the weight coefficient mA to the complex number calculator 2021A while outputting the weight coefficient nA to the complex number calculator 2022A. It is noted that each of the weight coefficient mA and the weight coefficient nA takes a value between 0 and 1 such that a sum of the weight coefficient mA and the weight coefficient nA is equal to 1.

The complex number calculator 2021A is configured to calculate a frequency spectrum cAA using the phase spectrum pA input from the phase calculator 14A and the weight coefficient mA input from the weight coefficient calculator 2020A (in this case, the weight coefficient mA is considered as the amplitude spectrum), and output the calculated frequency spectrum cAA to the adder 2023A. The complex number calculator 2022A is configured to calculate a frequency spectrum cBA using the phase spectrum pB input from the phase calculator 14B and the weight coefficient nA input from the weight coefficient calculator 2020A (in this case, the weight coefficient nA is considered as the amplitude spectrum), and output the calculated frequency spectrum cBA to the adder 2023A.

The adder 2023A is configured to add up the frequency spectrum cAA and the frequency spectrum cBA input from the complex number calculators 2021A and 2022A, respectively, and output the addition result to the phase calculator 2024A.

The phase calculator 2024A is configured to obtain an argument in the complex plane from the addition result of the frequency spectrum cAA and the frequency spectrum cBA. Since this argument (i.e., phase) is calculated for each frequency, in the phase calculator 2024A, a phase spectrum in which the frequency spectrum cAA and the frequency spectrum cBA are synthesized is obtained.

The comparator 2025A is configured to compare the amplitude spectrum ftmA input from the time-axis weight calculator 182A with a threshold L, and output 1 when the amplitude spectrum ftmA is greater than the threshold L, and output 0 when the amplitude spectrum ftmA is equal to or less than the threshold L.

The multiplier 2026A is configured to multiply the phase spectrum input from the phase calculator 2024A by the output from the comparator 2025A (i.e., 0 or 1), and output the multiplication result to the adder 2029A. That is, the multiplier 2026A outputs the phase spectrum input from the phase calculator 2024A to the adder 2029A only when the amplitude spectrum ftmA is greater than the threshold L.

The multiplier 2028A is configured to multiply the phase spectrum pA input from the phase calculator 14A by the output of the NOT circuit 2027A (i.e., the inverted output of the comparator 2025A), and output the multiplication result to the adder 2029A. That is, the multiplier 2028A outputs the phase spectrum pA to the adder 2029A only when the amplitude spectrum ftmA is equal to or smaller than the threshold L.

The adder 2029A is configured to add up the phase spectrum input from the multiplier 2026A and the phase spectrum input from the multiplier 2028A. The adder 2029A outputs the phase spectrum PA obtained by the adding to the complex number calculator 22A. In the present embodiment, the weight coefficient mA and the weight coefficient nA are constants of 1 and 0, respectively. Therefore, the phase spectrum PA is the same as the phase spectrum pA input from the phase calculator 14A to the complex number calculator 2021A.

According to the present embodiment, the phase controller 202A does not change a phase of the priority audio signal in order to emphasize the audibility of the priority sound. In another embodiment, the phase controller 202A may change the phase of the priority audio signal within a range where the priority sound is not hard to be listened to.

FIGS. 15A and 15B show block diagrams of the amplitude controller 200B and the phase controller 202B, respectively.

As shown in FIG. 15A, the amplitude controller 200B includes multipliers 2000B, 2001B, a comparator 2002B, a NOT circuit 2003B, a multiplier 2004B and an adder 2005B. As shown in FIG. 15B, the phase controller 202B includes a weight coefficient calculator 2020B, complex number calculators 2021B and 2022B, an adder 2023B, a phase calculator 20249, a comparator 2025B, a multiplier 2026B, a NOT circuit 2027B, a multiplier 2028B and an adder 2029B. It is noted that configuration of the amplitude controller 200B is the same as that of the amplitude controller 200A, and configuration of the phase controller 202B is the same as that of the phase controller 202A. Therefore, detailed descriptions of the amplitude controller 200B and the phase controller 202B will be omitted.

The amplitude controller 200B is configured to attenuate the amplitude spectrum aB input from the amplitude calculator 16B by multiplying with the control gain gB in a band in which the amplitude spectrum ftmA is greater than the threshold K, and output the attenuated amplitude spectrum aB to the complex number calculator 22B, Hereinafter, for convenience of explanation, the amplitude spectrum output to the complex number calculator 22B will be referred to as an "amplitude spectrum AB."

The amplitude controller 200B is configured to attenuate the amplitude of the non-priority audio signal by performing a multiplication process using the control gain gB (i.e., a parameter taking a value corresponding to the amplitude ratio of the amplitude spectrum ftmA and the amplitude spectrum ftmB which are weighted taking the frequency masking and the time masking into account) and thereby suppress the masking of the priority sound by the non-priority sound. However, in order to avoid a situation in which the non-priority sound becomes difficult to be listened to by attenuating the amplitude of the non-priority audio signal, the amplitude controller 200B does not excessively attenuate the amplitude of the non-priority audio signal while limiting the band in which attenuating is performed to the control target band. Illustratively, the amplitude controller 200B does not attenuate the amplitude of the non-priority audio signal when the amplitude spectral ftmA is fully larger than the amplitude spectral ftmB.

In the present embodiment, the amplitude spectrum aA is relatively amplified in the controlled target band by amplifying the amplitude spectrum aA while attenuating the amplitude spectrum aB in order to obtain an effect of suppressing masking of the audio guidance by the music to ensure the audibility of the audio guidance. In another embodiment, only one of amplification of the amplitude spectrum aA and attenuation of the amplitude spectrum aB may be performed to relatively amplify the amplitude spectrum aA in the control target band.

The adder 2029B is configured to add up the phase spectrum output from the multiplier 2026B and the phase spectrum output from the multiplier 2028B, and output the phase spectrum PB obtained thereby to the complex number calculator 22B.

FIGS. 16A and 16B show functions held by the weight coefficient calculator 2020B, As shown in FIGS. 16A and 16B, the weight coefficient calculator 2020B holds a weight function 1B and a weight function 2B. The weight coefficient calculator 2020B is configured to calculate the weight coefficient mB and the weight coefficient nB being a value corresponding to the control gain gB input from the control gain calculator 183, and output the weight coefficient mB to the complex number calculator 2021B and output the weight coefficient nB to the complex number calculator 2022B. The weight coefficient mB and the weight coefficient nB also take the value between 0 and 1, as well as the weight coefficient mA and the weight coefficient nA, such that a sum of the weight coefficient mB and the weight coefficient nB is equal to 1.

According to the weight function 1B and the weight function 2B, the smaller the control gain gB (in other words, the smaller the amplitude spectrum ftmA with respect to the amplitude spectrum ftmB), the larger the weight coefficient mB and the smaller the weight coefficient nB.

The weight coefficient calculator 2020B is configured to calculate the frequency spectrum cAB using the phase spectrum pA and the weight coefficient mB (here, the weight coefficient mB is considered to be the amplitude spectrum). The weight coefficient mB has a larger value as the amplitude spectrum ftmA is smaller with respect to the amplitude spectrum ftmB. Further, the weight coefficient calculator 2020B is configured to calculate the frequency spectrum cBB using the phase spectrum pB and the weight coefficient nB (here, the weight coefficient nB is considered to be the amplitude spectrum). The weight coefficient nB has a smaller value as the amplitude spectrum ftmA is larger with respect to the amplitude spectrum ftmB. As a result, in the control target band, the phase spectrum pB of the non-priority audio signal is matched to the phase spectrum pA of the priority audio signal. By matching the phase spectrum pB to the phase spectrum pA, it can be prevented that the priority sound is canceled by the non-priority sound and becomes hard to be listened to.

Although it is ideal that the phase spectrum pB is perfectly coincide with the phase spectrum pA, when the phase spectrum pB is adjusted so as to approach the phase spectrum pA, the effect of reducing the cancellation of the priority sound by the non-priority sound is obtained, thereby the audibility of the priority sound is improved.

Each of the amplitude controllers 200A and 200B operates as an amplitude modifying circuit configured to change the amplitude spectrum of at least one of the priority audio signal and the non-priority audio signal based on the amplitude spectrum after the weighting process by the weighting circuit (more particularly, based on a control value obtained in accordance with the amplitude spectrum after the weighting process) to relatively amplifies the amplitude spectrum of the priority audio signal in the control target band.

Further, each of the phase controllers 202A and 202B operate as a phase changer configured to change the phase spectrum of at least one of the priority audio signal and the non-priority audio signal based on the amplitude spectrum after the weighting operation by the weighting circuit (more particularly, based on the control values obtained in accordance with the amplitude spectrum after the weighting operation), to make the phase spectrum of the non-priority audio signal approach the phase spectrum of the priority audio signal in the control target band.

The complex number calculator 22A is configured to calculate a frequency spectrum in the control target band based on the amplitude spectrum AA input from the amplitude controller 200A and the phase spectrum PA input from the phase controller 202A, and output the calculated frequency spectrum to the adder 24A.

The adder 24A is configured to add up the frequency spectrum in the control target band of the priority audio signal input from the complex number calculator 22A and the frequency spectrum in a band other than the control target band of the priority audio signal input from the BSF 122 of the band divider 12A, and output the addition result to the adder 26.

The complex number calculator 22B is configured to calculate the frequency spectrum in the control target band based on the amplitude spectrum AB input from the amplitude controller 200B and the phase spectrum PB input from the phase controller 202B, and output the calculated frequency spectrum to the adder 24B.

The adder 24B is configured to add up the frequency spectrum in the control target band of the non-priority audio signal input from the complex number calculator 22B and the frequency spectrum in a band other than the control target band of the non-priority audio signal input from the BSF 122 of the band divider 12B, and output the addition result to the adder 26.

The adder 26 is configured to add up the frequency spectrum, which is input from the adder 24A, of the priority audio signal whose amplitude within the control target band have been changed and the frequency spectrum, which is input from the adder 24B, of the non-priority audio signal whose amplitude and phase within the control target band have been changed, and output the addition result to the IFFT circuit 28.

That is, the adder 26 operates as a mixer configured to mix the priority audio signal and the non-priority audio signal after the changing process of the amplitude spectrum by the amplitude changer and the changing process of the phase spectrum by the phase changer.

The IFFT circuit 28 is configured to convert the frequency spectrum input from the adder 26 from the frequency domain to the time domain by a short-time inverse Fourier transform process, perform the overlapping process and the weighting process using the window function, and output it to a speaker (not shown) embedded in the car. That is, the IFFT circuit 28 operates as a second converter configured to overlap at least one of the priority audio signal and the non-priority audio signal after the changing process of the amplitude spectra and the changing process of the phase spectra by the spectrum controller 20A or 20B, and convert the frequency spectrum into a time-domain signal.

By the overlapping process in the FFT circuits 10A and 10B and the IFFT circuit 28, discontinuities in waveforms of the priority audio signal and the non-priority audio signal caused by changing of the amplitude spectrum and the phase spectrum in the spectrum controller 20A and 20B are smoothed.

Thus, according to the present embodiment, the weighting taking the frequency masking and the time masking into account is performed with respect to the amplitude spectra of the audio guidance signal and the music signal. The amplitude of the music is amplified while the amplitude of the audio guidance signal is attenuated in a frequency band of the human voice (i.e., the control target band) based on the weighted amplitude spectrum (in other words, taking masking between the audio guidance and the music into account), and the phase of the music signal is matched to the phase of the audio guidance signal. Thereby, when the music is played, the masking of the audio guidance by the music is suppressed and audibility of the audio guidance can be secured.

In the present embodiment, the mixing process is performed using the data of the frequency spectrum having a small number of dimensions. Therefore, the processing load is suppressed as compared with processing load of the conventional mixing processing of performing the mixing process using the data on the time-frequency plane having a large number of dimensions.

FIGS. 17A to 20B show specific processing examples.

FIG. 17A shows the amplitude spectrum of the priority audio signal to which the mixing process according to the present embodiment has not been performed. FIG. 17B shows the amplitude spectrum of the priority audio signal to which the mixing process according to the present embodiment has been performed. FIG. 18A shows the amplitude spectrum of the non-priority audio signal to which the mixing process according to the present embodiment has not been performed. FIG. 18B shows the amplitude spectrum of the non-priority audio signal to which the mixing process according to the present embodiment has been performed.

In FIGS. 17A, 17B, 18A and 18B (further in FIGS. 20A and 20B described later), each vertical axis indicates the frequency (unit: kHz), and each horizontal axis indicates the time (unit: sec). In these figures, a band with a higher power is represented by higher brightness, and a band with a lower power is represented by lower brightness.

When comparing FIG. 17A and FIG. 17B, it can be seen that FIG. 17B is whitish (i.e., represented by higher brightness) on the whole in the control target band, that is, the amplitude is amplified. When comparing FIG. 18A and FIG. 18B, it can be seen that FIG. 18B is blackish (i.e., represented by lower brightness) on the whole in the control target band, that is, the amplitude is attenuated.

FIG. 19 shows a phase difference between the phase spectrum of the non-priority audio signal to which the mixing according to the present embodiment has not been performed and the phase spectrum of the non-priority audio signal to which the mixing according to the embodiment of the present disclosures has been performed. In FIG. 19, the vertical axis indicates the frequency (unit: kHz) and the horizontal axis indicates the time (unit: sec). In FIG. 19, a band with larger phase difference between when the mixing process according to the present embodiment is performed and when the mixing process according to the present embodiment is not performed (i.e., the changing amount of the phase given to the non-priority audio signal in the mixing process according to the present embodiment) is represented by higher brightness, and a band with smaller phase difference is represented by lower brightness. The band in which this phase difference equals to zero is shown in black.

As shown in FIG. 19, it can be seen that the phase difference occurs in the control target band.

FIG. 20A shows a mixing signal obtained by mixing the priority audio signal to which the mixing process according to the present embodiment has not been performed and the non-priority audio signal to which the mixing process according to the present embodiment has not been performed. FIG. 20B shows a mixing signal of the priority audio signal and the non-priority audio signal output from the IFFT circuit 28 when amplitude amplification shown in FIG. 17B is applied to the priority audio signal and amplitude attenuation shown in FIG. 18B and phase change shown in FIG. 19 are applied to the non-priority audio signal.

Comparing FIG. 20A and FIG. 20B, it can be seen that, in the mixing signal output from IFFT circuit 28, the spectrogram shape of the priority audio signal is clearly shown and the amplitude of the non-priority audio signal is not significantly attenuated as a whole. Because, in the control target band, the amplitude of the priority audio signal is amplified and the amplitude of the non-priority audio signal is attenuated and the phase of the non-priority audio signal is matched to the phase of the priority audio signal. Therefore, it can be understood that masking of the priority sound by the non-priority sound is suppressed in the situation where the non-priority sound is played, and the audibility of the priority sound is secured.

The above is a description of exemplary embodiments of the present disclosures. It is noted that the embodiments of the present disclosures are not limited to those described above, and various modifications are possible within the scope of the technical idea of the present disclosures. For example, appropriate combination of examples exemplarily described in the specification, obvious examples and the like is included in the embodiments of the present application.

Incidentally, each process in the mixing apparatus 1 is executed by cooperation between software and hardware provided in the mixing apparatus 1. At least the OS (Operating System) of the software included in the mixing apparatus 1 is provided as an embedded system, but other parts, for example, software modules for performing mixing of the priority audio signal and the non-priority audio signal may be provided as an application that can be distributed on networks or held in a recording medium such as a memory card.

What is claimed is:

1. A mixing apparatus configured to mix a first audio signal representing a first sound and a second audio signal representing a second sound to enable a listener to listen to the first sound in a more prioritized manner than the second sound, comprising:
    a weighting circuit configured to perform weighting, within a particular control target band, an amplitude spectrum of at least one of the first audio signal and the second audio signal taking at least one of frequency masking and time masking into account;
    an amplitude changer configured to perform an amplitude spectrum changing process of relatively amplifying an amplitude spectrum of the first audio signal within the control target band by changing the amplitude spectrum of the at least one of the first audio signal and the second audio signal based on the amplitude spectrum to which the weighting has been applied;
    a phase changer configured to perform a phase spectrum changing process of making a phase spectrum of the second audio signal approach a phase spectrum of the first audio signal, within the control target band, by changing a phase spectrum of at least one of the first audio signal and the second audio signal based on the amplitude spectrum to which the weighting has been applied; and
    a mixer configured to generate a mixed audio signal by mixing the first audio signal and the second audio signal on which the amplitude spectrum changing process and the phase spectrum changing process have been performed.

2. The mixing apparatus according to claim 1,
    wherein the weighting circuit, by performing weighting the amplitude spectrum taking the frequency masking into account, widens a shape of the amplitude spectrum of the at least one of the first audio signal and the second audio signal within the control target band such that the shape simulates a range in which a sound having an amplitude spectrum masks other sounds on a frequency axis.

3. The mixing apparatus according to claim 1,
    wherein weighting taking the frequency masking into account is weighting of more widening a bandwidth of a shape of the amplitude spectrum as frequency increases.

4. The mixing apparatus according to claim 1,
    wherein the weighting circuit, by performing weighting the amplitude spectrum taking the time masking into account, widens a shape of the amplitude spectrum of the at least one of the first audio signal and the second audio signal within the control target band such that the shape simulates a range in which a sound having the amplitude spectrum masks other sounds on a time axis.

5. The mixing apparatus according to claim 1, further comprising a calculator configured to calculate a particular control value based on an amplitude ratio, within the control target band, of the first audio signal and the second audio signal to which the weighting have been applied.

6. The mixing apparatus according to claim 5,
    wherein the amplitude changer amplifies the amplitude spectrum of the first audio signal and attenuates the amplitude spectrum of the second audio signal within the control target band based on the particular control value.

7. The mixing apparatus according to claim 5,
    wherein the phase changer changes only the phase spectrum of the second audio signal based on the particular control value, and matches the phase spectrum of the second audio signal to the phase spectrum of the first audio signal within the control target band.

8. The mixing apparatus according to claim 1, further comprising:
    a first converter configured to overlap each of the first audio signal and the second audio signal to convert into a frequency-domain signal; and
    a second converter configured to overlap the mixed audio signal to convert into a time-domain signal,
    wherein the weighting circuit performs the weighting the amplitude spectrum of the at least one of the first audio signal and the second audio signal, which has been converted to the frequency-domain signal by the first converter,
    wherein the amplitude changer changes the amplitude spectrum of the at least one of the first audio signal and the second audio signal, which has been converted to the frequency-domain signal converted by the first converter, and
    wherein the phase changer changes the phase spectrum of the at least one of the first audio signal and the second audio signal, which has been converted to the frequency-domain signal by the first converter.

9. A mixing method for mixing a first audio signal representing a first sound and a second audio signal representing a second sound to enable a listener to listen to the first sound in a more prioritized manner than the second sound, including:
    weighting, within a particular control target band, an amplitude spectrum of at least one of the first audio signal and the second audio signal taking at least one of frequency masking and time masking into account;
    performing an amplitude spectrum changing process of relatively amplifying an amplitude spectrum of the first audio signal within the control target band by changing the amplitude spectrum of the at least one of the first audio signal and the second audio signal based on the amplitude spectrum to which the weighting has been applied;

performing a phase spectrum changing process of making a phase spectrum of the second audio signal approach a phase spectrum of the first audio signal, within the control target band, by changing a phase spectrum of at least one of the first audio signal and the second audio signal based on the amplitude spectrum to which the weighting has been applied; and generating a mixed audio signal by mixing the first audio signal and the second audio signal on which the amplitude spectrum changing process and the phase spectrum changing process has been performed.

10. The mixing method according to claim 9,
wherein weighting taking the frequency masking into account includes widening a shape of the amplitude spectrum of the at least one of the first audio signal and the second audio signal within the control target band such that the shape simulates a range in which a sound having an amplitude spectrum masks other sounds on a frequency axis.

11. The mixing method according to claim 9,
wherein weighting taking the frequency masking into account includes widening a bandwidth of a shape of the amplitude spectrum as frequency increases.

12. The mixing method according to claim 9,
wherein weighting taking the time masking into account includes widening a shape of the amplitude spectrum of the at least one of the first audio signal and the second audio signal within the control target band such that the shape that simulates a range in which a sound having the amplitude spectrum masks other sounds on a time axis.

13. The mixing method according to claim 9, further including calculating a particular control value based on an amplitude ratio, within the control target band, of the first audio signal and the second audio signal to which the weighting have been applied.

14. The mixing method according to claim 13,
wherein the amplitude changing process includes amplifying the amplitude spectrum of the first audio signal and attenuating the amplitude spectrum of the second audio signal within the control target band based on the particular control value.

15. The mixing method according to claim 13,
wherein the phase spectrum changing process changes only the phase spectrum of the second audio signal based on the particular control value, and wherein the phase spectrum changing process includes matching the phase spectrum of the second audio signal to the phase spectrum of the first audio signal within the control target band.

16. The mixing method according to claim 9, further including:
overlapping each of the first audio signal and the second audio signal to convert into a frequency-domain signal; and
overlapping the mixed audio signal to convert into a time-domain signal,
wherein weighting the amplitude spectrum of the at least one of the first audio signal and the second audio signal includes weighting the amplitude spectrum of the at least one of the first audio signal and the second audio signal that has been converted to the frequency-domain signal,
wherein the amplitude spectrum changing process includes changing the amplitude spectrum of the at least one of the first audio signal and the second audio signal that has been converted to the frequency-domain signal, and
wherein the phase spectrum changing process includes changing the phase spectrum of the at least one of the first audio signal and the second audio signal that has been converted to the frequency-domain signal.

\* \* \* \* \*